United States Patent
Takahashi

(10) Patent No.: US 6,603,189 B2
(45) Date of Patent: *Aug. 5, 2003

(54) SEMICONDUCTOR DEVICE WITH DELIBERATELY DAMAGED LAYER HAVING A SHORTER CARRIER LIFETIME THEREIN

(75) Inventor: Hideki Takahashi, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/463,975
(22) PCT Filed: Aug. 14, 1997
(86) PCT No.: PCT/JP97/02835
§ 371 (c)(1),
(2), (4) Date: Feb. 14, 2000
(87) PCT Pub. No.: WO99/09600
PCT Pub. Date: Feb. 25, 1999

(65) Prior Publication Data
US 2003/0062584 A1 Apr. 3, 2003

(51) Int. Cl.$^7$ ............................................. H01L 29/861
(52) U.S. Cl. ................... 257/617; 257/612; 257/577; 438/328
(58) Field of Search ................. 257/617, 612, 257/655–657, 577, 565; 438/328

(56) References Cited

U.S. PATENT DOCUMENTS 5,981,981 A   11/1999 Takahashi .................. 257/133

FOREIGN PATENT DOCUMENTS

| EP | 0 368 768 | 5/1990 |
| JP | 47-2730 | 1/1972 |
| JP | 59-49714 | 12/1984 |
| JP | 62-141782 | 6/1987 |
| JP | 5-102161 | 4/1993 |
| JP | 8-46221 | 2/1996 |
| JP | 8-125200 | 5/1996 |
| JP | 08316500 A | * 11/1996 |

OTHER PUBLICATIONS

Translation of JP 08316500 suppiled by JPO.*
Translation of JP 08125200 suppiled by JPO.*
Translation of JP 08046222 suppiled by JPO.*
Translation of JP 05102161 suppiled by JPO.*
Mitsubishi Denki Giho, vol. 67, No. 9, pps. 94–97, "Soft Recovery Diode of Low Loss", 1933 (in Japanese with Partial English Translation).
T. Miura, et al., Proceesings of National Convention of IEEJ, Industrial Application Section, pps. 79–80, "Improvements on Recovery Characteristic of Diodes by Electron Irradiation and Proton Implantation", 1995 (in Japanese with Partial English Translation).

* cited by examiner

Primary Examiner—Minh Loan Tran
Assistant Examiner—Thomas L. Dickey
(74) Attorney, Agent, or Firm—Oblon, Spivak, McClelland, Maier & Neustadt, P.C.

(57) ABSTRACT

A technique of improving a reverse recovery characteristic of a semiconductor device which solves a technical problem of breakdown voltage reduction which has conventionally caused in enhancing soft recover. To solve the technical problem, in a PN junction between a P type layer and an N type layer, a heavy metal such as platinum is firstly diffused into an—layer and N+ layer of the N type layer. Subsequently, helium ion is implanted into the inside of the—layer from the interface between the P type layer and the N+ layer to a predetermined depth, so that the N− layer in the vicinity of the junction is damaged to form, in the—layer, a low lifetime region having a carrier lifetime smaller than that of the N type layer and a resistibility that decreases monotonically. Such a technique may be applied to diodes, and particularly, free-wheel diodes in power modules.

18 Claims, 17 Drawing Sheets

SEMICONDUCTOR DEVICE WITH DELIBERATELY DAMAGED LAYER HAVING A SHORTER CARRIER LIFETIME THEREIN

BACKGROUND OF THE INVENTION

1. Field of the Invention

This invention relates to a semiconductor device and manufacturing method thereof, and, in particular, relates to a suitable technique for improving recovery characteristic of diodes.

2. Discussion of the Background

FIG. 17 is a cross section illustrating a basic structure of a diode. In FIG. 17, on a surface of an N substrate 4P comprising an N+ layer 1P and N− layer 2P, an anode region 3P is formed by diffusing P type impurities. An anode electrode 5P is formed on a surface of the anode region 3P, and a cathode electrode 6P is formed on a rear surface of the N substrate 4P. Operation of the diode is described as follows.

In the structure of FIG. 17, a predetermined anode voltage VAK (forward bias) is applied between the anode electrode 5P and cathode electrode 6P and, when the anode voltage exceeds a certain threshold value (~0.6 V), holes are injected from the anode electrode 5P into the N− layer 2P, and thus the diode conducts. When a predetermined anode voltage VKA (reverse bias) is applied between the cathode electrode 6P and anode electrode 5P, no current flows in the diode until the reverse bias VKA reaches a breakdown voltage of a PN junction comprising the anode region 3P and N− layer 2P. The mentioned situation is shown in FIG. 18. Note that FIG. 18 is also employed in a description of preferred embodiments of the present invention, together with FIG. 19.

Meanwhile, characteristics obtained when an anode voltage applied to a diode is changed from forward bias to reverse bias is called reverse recovery characteristic (recovery characteristic), and it is known that the reverse recovery characteristic shows transition of current with time (transient response). In FIG. 19, symbol Irr denotes a peak value of current (recovery current) Ir that flows in the reverse direction, symbol Trr denotes time required until the current Ir flown in the reverse direction dissipates, and symbol If denotes a current value at the time of forward bias.

In the reverse recovery characteristic, there has been a desire for one in which the magnitude of the peak current Irr of the recovery current is small and current IR flowing in the reverse direction dissipates slowly. That is, with time T1, T2 determined as shown in FIG. 19, it is defined that recovery characteristic is hard when T1>T2, and recovery characteristic is soft when T1<T2. When a diode is used in a combination with a main switching element such as IGBT, if recovery characteristic is hard, heat generation is caused due to the occurrence of surge voltage and switching loss. Therefore, to avoid these, there is a desire for characteristics having a low loss and soft recovery (a reduction in the transition of current Ir with time dIr/dt). Hereinafter, the peak value Irr of the recovery current Ir is called "recovery peak current."

As to the transient response of the current Ir following in the reverse direction, the following points are found out by the recent researches and studies. That is, ① the recovery peak current Irr depends upon the carrier density of a semiconductor region in the vicinity of an anode electrode, and the recovery peak current Irr decreases as the carrier density decreases. In addition, ② it is known that the mentioned dissipation time Trr depends upon the carrier density of a semiconductor region in the vicinity of a cathode electrode, and the dissipation time Trr extends as the carrier density of the cathode region increases.

In view of these research results, a large number of structures for improving the reverse recovery characteristic have been proposed conventionally.

(I) In the first place, there is a technique which is, for example, disclosed in Japanese Patent Unexamined Publication No. P08-46221A, and pointed out as a conventional technique in Mitsubishi Denki Giho and Precedings of National Convention of IEEJ, Industrial Application Section, 1995 (No. 136, p79), both of which are described later. That is one in which a heavy metal represented by platinum serving as a lifetime killer, is doped and diffused from the anode electrode side, so that the lifetime of an N type layer in the vicinity of a PN junction part is controlled such as to be short. Especially, with this technique, the diffusion of platinum can be controlled such that the lifetime of the carriers in the N type layer on the cathode electrode side is longer than the lifetime of the surrounding of the PN junction part on the anode side. It is therefore possible to increase the carrier density on the cathode side, thereby increasing the mentioned dissipation time Trr.

Even with the first conventional technique, however, the problem remains in the point that it is not easy to control more shortly the lifetime of the carriers in the N type layer on the anode side, including the problems of homogeneity and reproducibility.

(II) A second conventional technique is one which is disclosed in Patent Publication No. 59(1984)-49714. A cross-sectional structure of a diode to which this conventional technique is applied is shown in FIG. 20. In FIG. 20, the same symbol as in FIG. 17 denotes the same. With the second conventional technique, an anode region 3P to be formed on a surface is formed partially for suppressing the injection of holes from the anode regions 3P, thereby the carrier density in the surrounding region of an anode electrode 5P is lowered to reduce a recovery peak current Irr.

In this structure, however, there newly arises the problem that, although the carrier density in the vicinity of the anode is controlled by the partially formed anode regions 3P and clearances W therebetween, a breakdown voltage lowers when the clearance W is too large, and thus this point constitutes obstruction to a sufficient control of the carrier density in the vicinity of the anode.

(III) As a diode structure employing a third conventional technique, there is one which is disclosed in Mitsubishi Denki Giho Vol. 67. No. 9. 1993, PP94–97. Although this is basically the same in structure as that shown in FIG. 17, it aims to improve reverse recovery characteristic by changing the structure of an anode region to be formed on a surface. That is, in the technique of the Technical Report, by reducing thickness of an anode region 3P shown in FIG. 17, and reducing the surface concentration of the anode region, injection of holes from the anode region 3P is suppressed and thus the carrier density in the vicinity of the anode is lowered to reduce a recovery peak current Irr. It is reported that, with this technique, the recovery peak current Irr is reduced by about 40%, and a slope dIr/dt at the time of recovery is reduced to about ½.

With this structure, it is however necessary to set thickness and concentration of the anode region 3P to a certain degree of value in order to ensure a breakdown voltage, and there are limitations in reducing thickness and concentration of the anode region. Therefore, as in the case with the second conventional technique (II), there remains the problem that the carrier in the vicinity of the anode cannot be controlled sufficiently.

(IV) In addition, as a diode structure to which a fourth conventional technique is applied, there is one which is disclosed in Precedings of National Convention of IEEJ, Industrial Application Section, 1995, PP79–80. This structure is shown in FIG. 21. In FIG. 21, the same symbol as in FIG. 17 denotes the same. Symbol 2PP in FIG. 21 shows a region that is damaged by proton implantation. In this conventional technique, in order to reduce loss at the time of recovery in a pin structure, an irradiation of electron beam is conducted in place of the mentioned platinum doping, to reduce the lifetime in the carriers in an n layer and increase a dissipation time Trr. Further, the lifetime of an n-layer is controlled locally by proton implantation, so that the carrier density in the vicinity of the anode region is lowered to diminish a recovery peak current Irr. Thereby, it is reported that a slope dIr/dt was reduced to below ½ and the recovery peak current Irr was reduced by about 40%, as compared with the case of employing an irradiation of electron beam alone.

However, the following problem can be pointed out relative to this structure. That is, as the present applicant proves later, when the amount of proton implantation (proton dose) is raised to a practical level, the breakdown voltage becomes markedly lower, such that the carrier in the vicinity of the anode region cannot be sufficiently controlled as in the case with the first, second and third conventional techniques.

In practice, the present applicant prepared experimentally the same sample as that of the fourth conventional technique by proton implantation. FIG. 22 shows the experimental result which was obtained by evaluating the withstand voltage or breakdown voltage of this prototype against an increase in proton dose. FIG. 22 also shows the result of measurement of the recovery peak current Irr against forward current If that has been flown prior to the recovery (see FIG. 19). In this experiment, by adjusting the accelerated energy of proton beam by a buffer such as aluminum foil, its dose is changed while proton implantation is applied to the vicinity of the anode, followed by heat treatment of 340° C. and the breakdown voltage is then evaluated to obtain the result. In FIG. 22, the abscissa indicates a proton dose expressed as a relative value, and the left ordinate indicates a breakdown voltage Vr and the right ordinate indicates a ratio (Irr/If). Hereat, as stated earlier, only proton dose is changed while fixing the depth where proton is implanted, or implantation position. As shown in FIG. 22, it is apparent that the breakdown voltage Vr decreases as the proton dose increases (see FIG. 23 for comparison). Note that the cause for this decrease in breakdown voltage Vr will be described later.

The case of the fourth conventional technique shown in FIG. 21 corresponds, in the experimental result of FIG. 22, to the case where the relative value of proton dose is approximately 1. However, in order that a low lifetime region having a further shorter carrier lifetime than that obtained by diffusion of a heavy metal or irradiation of electron beam, is formed effectively in an N− layer by proton implantation, (that is, in order to further reduce the recovery peak current Irr,) it is necessary to increase proton dose, and a value of about 10 to 100 $cm^{-3}$ in relative value is practically desired as a proton dose, as can be appreciated by the result of measurement of ratio (Irr/If) in FIG. 22

Upon this, as shown in FIG. 22, when proton dose is increased to such a degree of magnitude, the influence due to the deterioration of breakdown voltage increases to such a degree that it cannot be ignored, and thus device characteristics will eventually have to be impractical. This is a serious problem of the fourth conventional technique employing proton implantation. In this sense, it can be said that the fourth conventional technique failed to make a sufficient consideration of optimization as to a local lifetime control.

SUMMARY OF THE INVENTION

This invention has been accomplished for solving all the foregoing problems. That is, a first object of this invention is to realize a semiconductor device having a new structure characterized in that: as reverse recovery characteristic, even if the lifetime of carriers in a first semiconductor layer is controlled ① such that a recovery peak current (Irr) is further reduced by lowing the carrier density in the vicinity of a third semiconductor layer, and ② such that a recovery current dissipation time (Trr) is extended by raising the carrier density in the first semiconductor layer in the vicinity of the surface side opposed to the, interface between the first and second semiconductor layers, ③ there occurs no decrease in breakdown voltage.

In particular, the gist of this invention resides in satisfying the contents ① and ③ at the same time. In this case, the content ② can also be realized by applying, for example, the mentioned first conventional technique to optimize the carrier density of the first semiconductor layer. This point is also a secondary object of this invention.

A second object of this invention is to provide a manufacturing method for realizing a semiconductor device having characteristics of the contents ①, ③ and ②.

For achieving the first object, a semiconductor device in accordance with this invention is provided as the following first to ninth aspects.

Specifically, a semiconductor device according to the first aspect comprises: a first semiconductor layer of a first conductivity type; a second semiconductor layer of the first conductivity type having a first main surface and a second main surface opposed to the first main surface, the first main surface and a main surface of the first semiconductor layer forming a first interface; and a third semiconductor layer of a second conductivity type having a main surface which forms a second interface together with the second main surface of the second semiconductor layer, wherein a second lifetime in the second semiconductor layer is smaller than a first lifetime in the first semiconductor layer; and a resistance value in the second semiconductor layer decreases monotonically from the second interface to the first interface.

The second semiconductor layer is a low lifetime region having a high resistance value, and its resistance value merely decreases monotonically. Therefore, the carrier lifetime of the impurity increases monotonically from the second semiconductor layer to the first semiconductor layer. This enables to maintain a large value without deteriorating the breakdown voltage (withstand voltage) of a PN junction although the low lifetime region is generated between the first and third semiconductor regions. By such lifetime reduction, the carrier density in the vicinity of the second interface is reduced sufficiently. Thus, as compared to the mentioned first to fourth techniques, a peak value of a recovery current that flows when the bias applied to the PN junction is changed from forward bias to reverse bias, can be further reduced, and thus soft recovery characteristic can be improved considerably.

A semiconductor device according to the second aspect is characterized in that the second lifetime in the first aspect is smaller than 1/10 of the first lifetime.

Thereby, the carrier density of the first semiconductor layer is optimized. This permits on state voltage reduction when the device of this aspect is applied to a diode, and thus leads to an extension of recovery current dissipation time at the time of recovery.

A semiconductor device according to the third aspect is characterized in that a second resistibility of the second semiconductor layer in the first aspect is greater than 50 times of a first resistibility of the first semiconductor layer.

Thereby, the carrier density of the first semiconductor layer can be optimized.

A semiconductor device according to the fourth aspect is characterized in that the thickness between the first interface of the second semiconductor layer and the other main surface opposed to the main surface of the third semiconductor layer in the first aspect is set such that a peak value of current flowing when voltage applied between the first semiconductor layer and the third semiconductor layer is changed from forward bias to reverse bias is smaller than a peak value of the current on the assumption that the second semiconductor layer is absent.

Thereby, thickness of the second semiconductor layer is controlled to an optimum value that is required in view of an improvement of recovery characteristic of a diode. Therefore, when the device of this aspect is applied to a diode, it is possible to realize a diode having a softer recovery characteristic with a small recovery peak current, without causing deterioration in breakdown voltage.

A semiconductor device according to the fifth aspect is characterized in that the thickness in the fourth aspect is set to a value in a range of from 15 micrometers to 40 micrometers.

Thereby, the carrier density in the vicinity of the interface between the second and third semiconductor layers is reduced and the carrier density of the first semiconductor layer is optimized. Therefore, the recovery characteristic of a diode, namely, a peak current of a recovery current, can be further reduced, and the recovery current dissipation time can be further extended.

A semiconductor device according to the sixth aspect is characterized in that the semiconductor device in the fifth aspect is used as a free-wheel diode.

This realizes a free-wheel diode having a large breakdown voltage and a low loss soft recovery characteristic, thus making it possible to realize a power module having less power loss due to surge voltage or the like.

A semiconductor device according to the seventh aspect comprises: a first semiconductor layer of a first conductivity type; a second semiconductor layer of the first conductivity type which is formed on a surface of the first semiconductor layer and damaged throughout all regions thereof by implantation of a predetermined ion except for hydrogen ion; and a third semiconductor layer of a second conductivity type which is formed on a surface of the second semiconductor layer.

Thereby, when the second semiconductor layer is damaged, it merely turns to be a high resistance region and it cannot become a donor nor acceptor. Further, in the second semiconductor layer, resistibility decreases monotonically, and the carrier lifetime is shortened sufficiently than that of the carriers in the first semiconductor layer. Thereby, the carrier density in the vicinity of the interface between the second and third semiconductor layers is reduced sufficiently. As a result, the recovery peak current in the recovery characteristic obtained when the device of this aspect is applied to a diode is reduced sufficiently, and breakdown voltage is free from any influence.

A semiconductor device according to the eighth aspect is characterized in that the predetermined ion in the seventh aspect is helium ion.

Thereby, the second semiconductor layer can be easily provided with the property serving as a low lifetime region by implanting a general-purpose ion, i.e., helium ion.

A semiconductor device according to the ninth aspect is characterized in that the first semiconductor layer in the eighth aspect comprises diffused heavy metals.

Thereby, the carrier lifetime of the first semiconductor layer is longer than the lifetime of the second semiconductor layer, and the carrier density of the first semiconductor layer is optimized. Therefore, when the device of this aspect is applied to a diode, time required until a recovery current at the time of recovery dissipates completely can be further extended by preventing an increase in on state voltage generated upon formation of a low lifetime layer, during on state.

For achieving the mentioned second object, a method of manufacturing a semiconductor device according to this invention is provided as the following tenth to sixteenth aspects.

Specifically, a method of manufacturing a semiconductor device according to the tenth aspect comprises: a first step of preparing a first semiconductor layer of a first conductivity type having a first lifetime; a second step of forming a second semiconductor layer of a second conductivity type on a surface of the first semiconductor layer; and a third step of forming a low lifetime region extending from the surface of the first semiconductor layer to a predetermined position of the inside of the first semiconductor layer and having a second lifetime smaller than the first lifetime and a resistance value monotonically decreasing from the surface of the first semiconductor layer.

With the tenth aspect of the invention, since the low lifetime region is formed, it is possible to realize a semiconductor device in which a junction comprising the first and second semiconductor layers has ① no deterioration in breakdown voltage, and ② a soft recovery characteristic with, a further small peak value of recovery current.

A method of manufacturing a semiconductor device according to the eleventh aspect is characterized in that the third step in the tenth aspect comprises a step of implanting a predetermined ion except for hydrogen ion, from the surface side of the second semiconductor layer to the predetermined position in the inside of the first semiconductor layer.

With the eleventh aspect of the invention, the low lifetime region can be formed with ease by a physical method of implanting a predetermined ion except for proton, thereby providing a method of manufacturing a semiconductor device which is realized easily.

A method of manufacturing a semiconductor device according to the twelfth aspect is characterized in that the predetermined ion in the eleventh aspect is helium ion.

With the twelfth aspect of the invention, there is the effect of providing a practical method of manufacturing a semiconductor device in the point that it is possible to manufacture a semiconductor device of a new structure by using a general-purpose helium ion source.

A method of manufacturing a semiconductor device according to the thirteenth aspect is characterized in that the depth from the surface of the second semiconductor layer to the predetermined position in the eleventh aspect is controlled in a range of from 15 micrometers to 40 micrometers.

With the thirteenth aspect of the invention, the depth where a predetermined ion is implanted can be controlled suitably. This leads to the effect that a semiconductor device having an improved soft recovery characteristic can be manufactured reliably with no influence upon breakdown voltage. Especially with this aspect, the low lifetime region can be formed such as to exert no influence on the first lifetime of the first semiconductor layer.

A method of manufacturing a semiconductor device according to the fourteenth aspect is characterized in that the third step in the eleventh aspect further comprises a step of performing a first heat treatment to the semiconductor device after the step of the predetermined ion implantation.

With the fourteenth aspect of the invention, a predetermined heat treatment is performed to the part which is damaged by a predetermined ion implantation. This leads to the effect that the damaged part can be formed steadily.

A method of manufacturing a semiconductor device according to the fifteenth aspect is characterized in that: the second step in the fourteenth aspect further comprises a step of forming a main electrode on a surface of the second semiconductor layer; and the predetermined ion implantation is performed by using a predetermined ion source disposed on the main electrode side.

With the fifteenth aspect of the invention, the predetermined ion source is disposed on the first main electrode side. Therefore, a predetermined ion can be implanted from the surface side of the second semiconductor layer into the first semiconductor layer in the vicinity of the interface between the first and second semiconductor layers. Thereby, it is possible to control such that a predetermined ion implantation position with respect to the interface has less variation.

A method of manufacturing a semiconductor device according to the sixteenth aspect is characterized in that the second step in the fourteenth aspect further comprises a step of diffusing a heavy metal from the surface of the first semiconductor layer to the inside of the first semiconductor layer and performing a second heat treatment after the step of forming the second semiconductor layer.

The sixteenth aspect of the invention produces the following advantages.

Specifically, since the relationship of: (the second heat treatment temperature)>(the first heat treatment temperature) is established, the influence of the second heat treatment on the third step can be offset by performing the higher-temperature second heat treatment prior to the first heat treatment. That is, the carrier lifetime control by a predetermined ion implantation and the lifetime control by diffusion of a heavy metal can be performed separately. With this aspect, the inside of the first semiconductor layer is subjected to lifetime reduction caused by the heavy metal, resulting in a distribution that the first lifetime of the first semiconductor layer increases monotonically from the interface between the first semiconductor layer and the low lifetime region to the inside of the first semiconductor layer. Therefore, the reverse current dissipation time in recovery characteristic can be extended by increasing the carrier density on the opposite surface side to the interface between the first semiconductor layer and the low lifetime region.

Hereinafter, the objects, features, aspects and advantages of this invention will be described in detail with reference to the accompanying drawings.

DESCRIPTION OF THE PREFERRED EMBODIMENTS

First Preferred Embodiment

A semiconductor device having a new pin structure is provided in a first preferred embodiment. As a suitable example of this semiconductor device, an example where the present invention is applied to a diode is described herein. A diode according to this embodiment has a damage region characterized in that a resistance value is monotonically decreased from an interface by damage caused by predetermined helium ion implantation from the interface between a P layer and N layer of a PN junction to a predetermined depth or position in the N layer. The fact that such a damage region is formed in the N layer in the vicinity of the interface or junction enables to realize a softer recovery characteristic without causing any influence on withstand or breakdown voltage (it remains unchanged). Hereinafter, the diode having the damage region is described through a more specific analysis.

Figure 1:
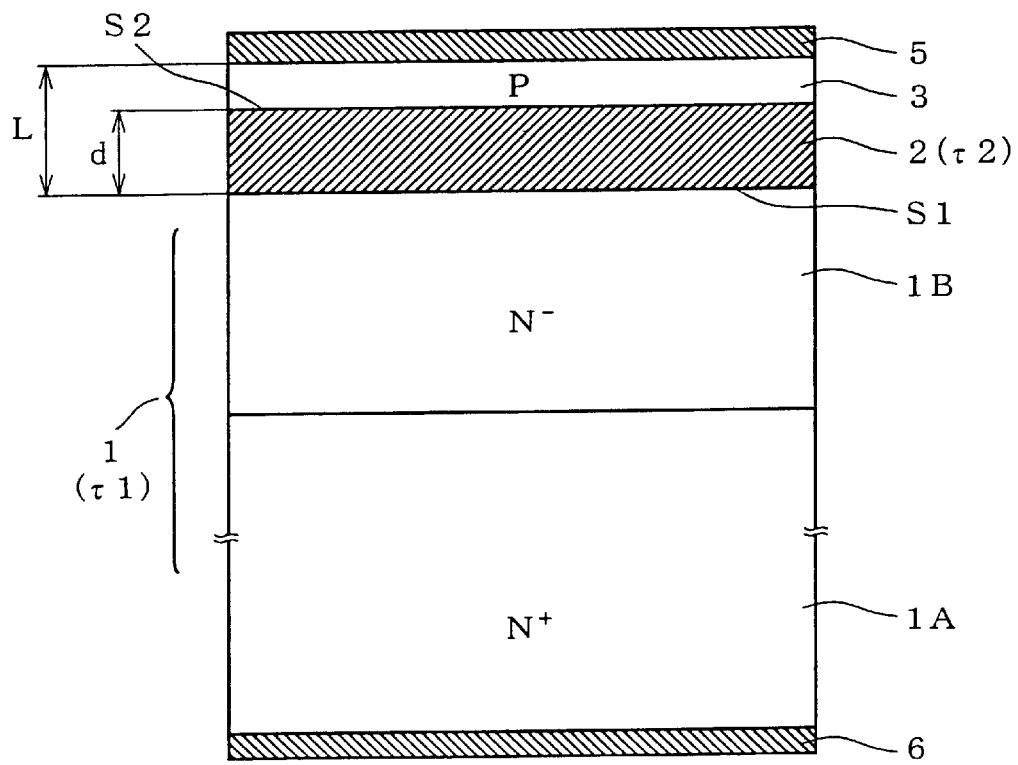
FIG. 1 is a longitudinal cross section illustrating the structure of a diode in a first preferred embodiment of this invention.

(1) FIG. 1 is a longitudinal cross section of a diode according to the first preferred embodiment of this invention. In FIG. 1, a first semiconductor layer (N type substrate) of a first conductivity 1 comprises a cathode N+ layer 1A and N− layer 1B formed thereon. In this embodiment, N type conductivity type corresponds to the first conductivity type.

Formed on a first main surface of the first semiconductor layer 1 is a second semiconductor layer 2 having the same N type conductivity type in a state of being damaged by implantation of a light ion (e.g., He ion). A first main surface of the second semiconductor layer 2 and the first main surface of the first semiconductor layer 1 form a first interface S1. The second semiconductor layer 2 is a feature of this embodiment and, as can be understood later from the following description, the layer 2 is a region that has (i) a lifetime (called second lifetime) τ2 shorter or smaller than a lifetime τ1 (called first lifetime time ) of carriers in the first semiconductor layer 1; and (ii) a resistance value that decreases monotonically. Hereinafter, the second semiconductor layer 2 is called "low lifetime layer or low lifetime region."

Disposed on the second main surface of the low lifetime layer 2 (opposed to the first main surface) is a third semiconductor layer (which corresponds to an anode layer, and is called anode P layer hereinafter) 3 formed by diffusion of impurity of a second conductivity type (P type herein). The second main surface of the layer 2 and the second main surface of the layer 3 form a second interface S2. Here, thickness of the anode P layer 3 is set to a small value, namely, approximately 3 μm.

Further, an anode electrode (first main electrode ) 5 is formed on the first main surface of the anode P layer 3, and a cathode electrode (second main electrode) 6 is formed on the second main surface corresponding to the rear surface of the cathode N+ layer 1A.

Hereat, for example, diffusion of a heavy metal such as Pt or Au in the mentioned first conventional technique, is applied to this diode, and diffusion time or diffusion temperature of the heavy metal is controlled such that the lifetime τ1 of carriers in the first semiconductor layer 1 is longer than that (τ2) of the low lifetime layer 2, thereby increasing the carrier density of the cathode side. Strictly, since the diffusion coefficient of the heavy metal in the first semiconductor layer 1 has a slight slope, the lifetime (τ1A) on the cathode N+ layer 1A side is slightly longer than the lifetime (τ1B) of the N− layer 1B. This technique is, of course, for increasing the recovery current dissipation time Trr shown in FIG. 19.

Also, from the point of view of that the recovery peak current Irr has a smaller value than it had conventionally, and no influence is exerted on an extension of the recovery current dissipation time Trr that is obtained by application of the technique of diffusion of a heavy metal, thickness of the low lifetime layer 2 or depth d from the second interface S2 is controlled to a value in a predetermined range as described later.

(2) Operation of a diode of this embodiment is described as below.

In the structure of FIG. 1, a predetermined anode voltage VAK is applied between the anode electrode 5 and cathode electrode 6, as forward bias (see FIG. 18) and, when the anode voltage VAK exceeds a threshold value (~0.6 V), holes are injected from the anode electrode 5 into the N− layer 1B via the low lifetime layer 2, and thus the diode conducts. When the anode voltage VAK is equal to the on state voltage value Vf shown in FIG. 18, a rated current If flows. On the other hand, when a predetermined anode voltage VKA is applied between the cathode electrode 6 and anode electrode 5, as reverse bias (see FIG. 18), only the low lifetime layer 2 is formed in the diode unless the anode voltage VKA exceeds a breakdown voltage Vr.

The low lifetime layer 2 has no influence on the breakdown voltage of a PN junction, as described later. Therefore, the diode of this structure produces the advantage that ③ breakdown voltage has lesser reduction than that of a diode in which a low lifetime layer 2 is not formed. In addition, since the low lifetime layer 2 is formed on the anode side, the carrier density in the vicinity of the anode is reduced considerably. Thereby, there are obtained, at the same time, ① the advantage that the recovery peak current Irr at the time of recovery (see FIG. 19) can be further reduced than the mentioned first to fourth conventional techniques. In this diode, a heavy metal is previously diffused in the first semiconductor layer 1 as in the first conventional technique. By controlling the quantity of diffusion, the lifetime on the cathode N+ layer 1A side is extended to increase the carrier density on the cathode side. It is therefore possible that ② the recovery current dissipation time Trr (see FIG. 19) is extended by lowing on state voltage Vf during on state (see FIG. 18).

Figure 2:
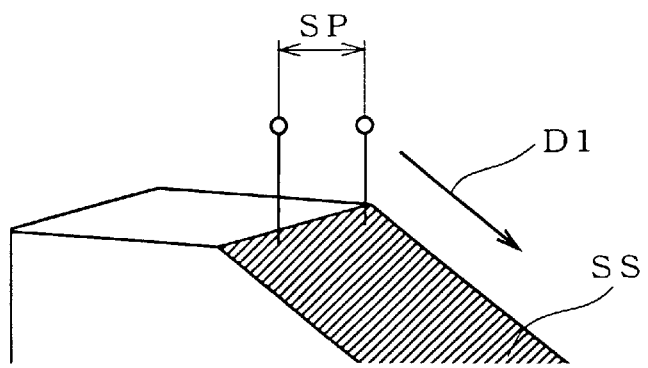
FIG. 2 is a diagram schematically showing a SR measuring method.

(3) To prove the advantage of the diode structure of FIG. 1 with helium ion implantation relative to proton implantation in the above-mentioned conventional fourth technique, the influence of their respective implantation upon breakdown voltage has been investigated. The investigation has been performed by measuring, after implanting a charged particle (H+ or He+), a spread resistance (hereinafter called SR) of each sample subjected to heat treatment. Here, SR measurement means to perform the following known measurement technique. Specifically, for example, a semiconductor element is polished obliquely as schematically illustrated in FIG. 2 (of course, it may be polished vertically), and two electrode needles are brought into contact with the polished surface SS and moved along a direction Dl to measure resistance caused by a spread SP between the needles (i.e., spreading resistance).

Figure 3:
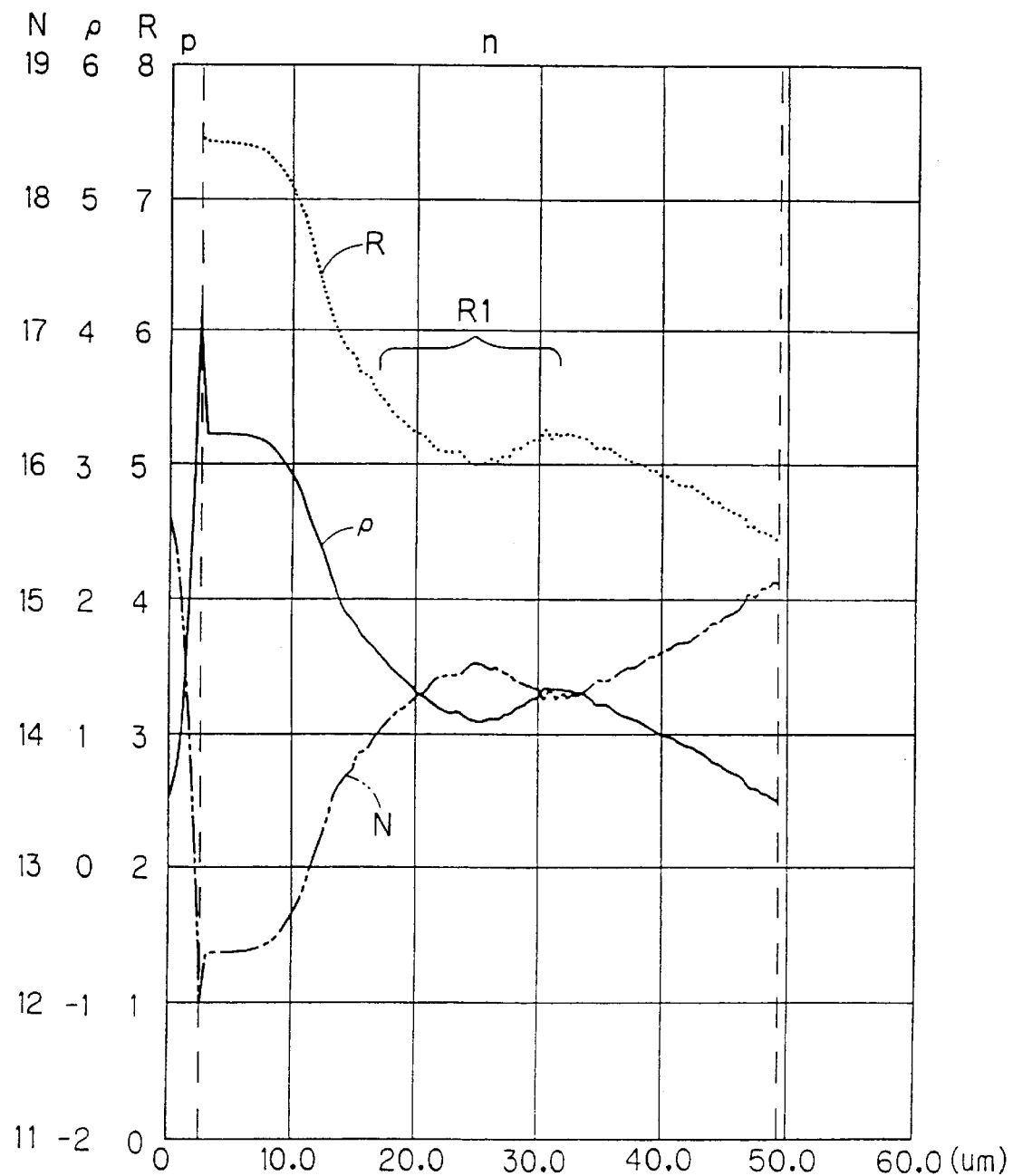
FIG. 3 is a diagram showing the result of SR measurement of a diode when the conventional fourth technique is applied.
Figure 4:
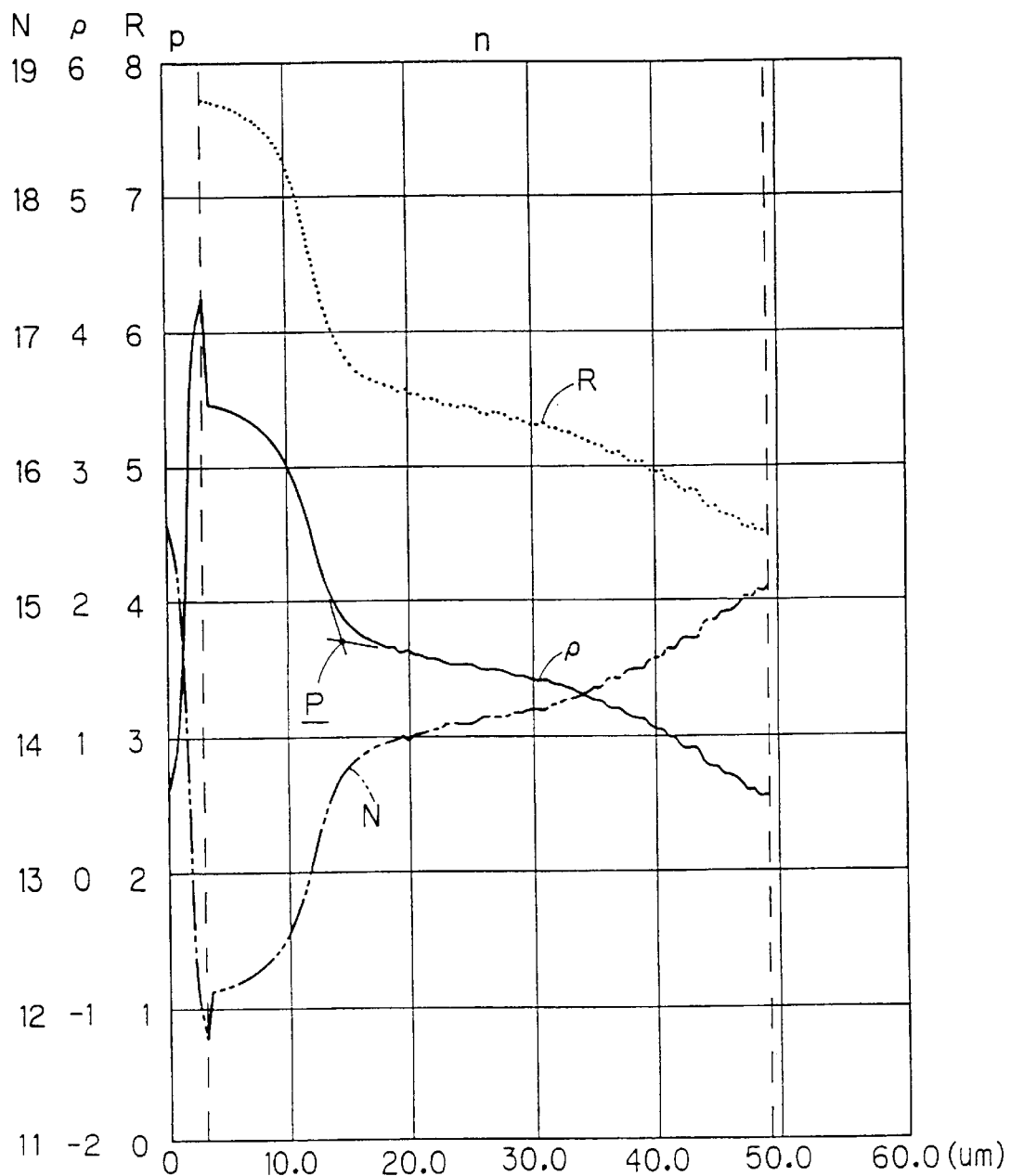
FIG. 4 is a diagram showing the result of SR measurement of the diode of the first preferred embodiment.
Figure 22:
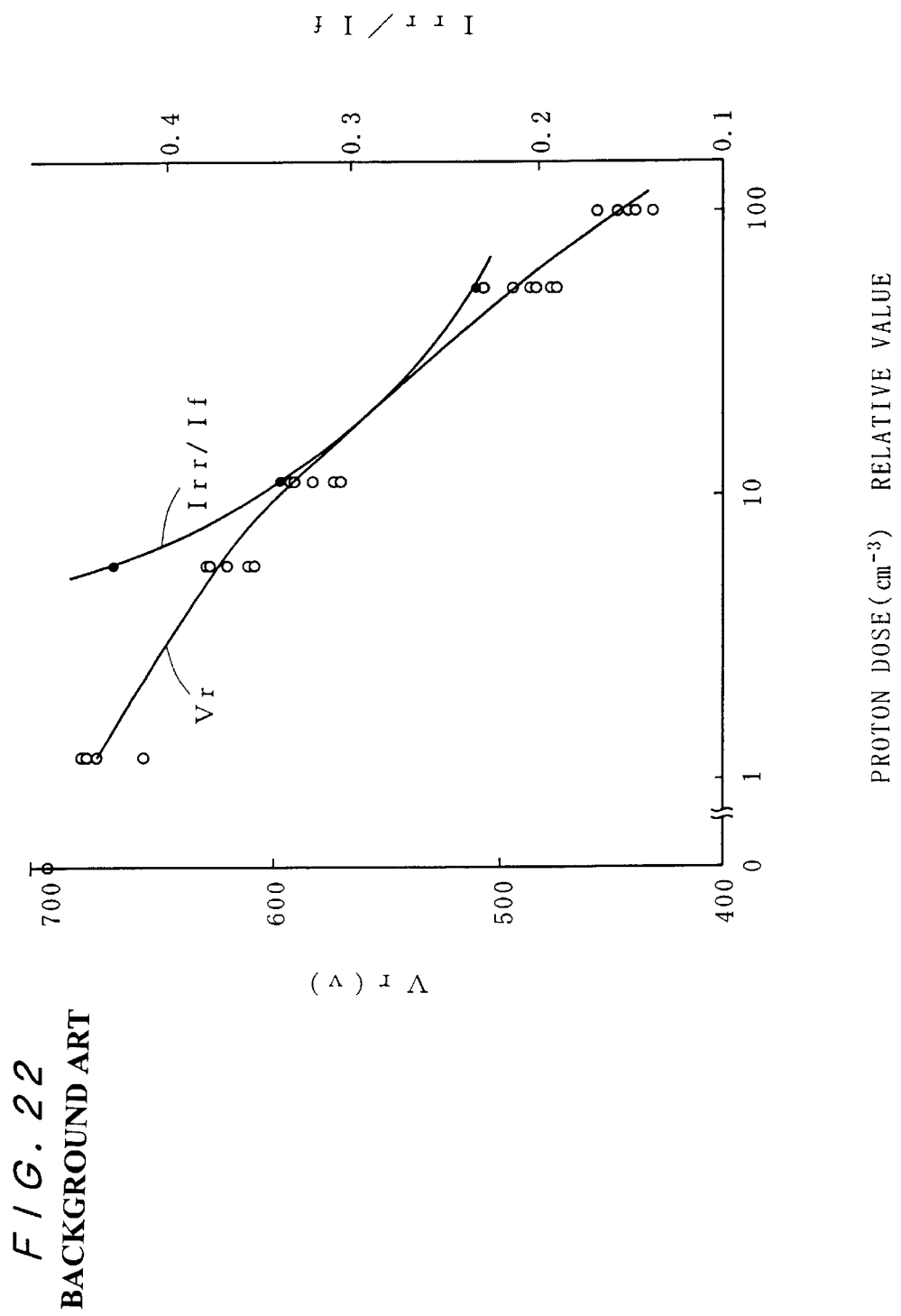
FIG. 22 is a diagram showing the relationship between proton dose, breakdown voltage, and recovery peak current, in a diode to which the conventional fourth technique is applied.

The result of SR measurement obtained by performing a conventional proton implantation, and the result of SR measurement of the device subjected to He ion implantation, are shown in FIGS. 3 and 4, respectively. The measurements shown in FIGS. 3 and 4 were carried out by using a measuring instrument of SOLID STATE MEASUREMENTS, INC., USA. The abscissa of FIGS. 3 and 4 corresponds to a position where a charged particle is implanted, which is given as depth L from a first main surface of the anode P layer 3 in FIG. 1. In FIGS. 3 and 4, the results of measurement R, ρ and N designate a spreading resistance, resistivity of an element, and impurity concentration, respectively. For silicon, there are a known reduced value between spreading resistance R and resistivity ρ or impurity concentration N. Therefore, if only spreading resistance R is measured, by using the reduced value, the value of resistivity ρ, and then impurity concentration N can be calculated automatically. The ordinate of FIGS. 3 and 4 is indicated by logarithmic scale. Samples which were used in the measurements of FIGS. 3 and 4 were produced by using the same substrate and material, and the sole difference therebetween was a radiation source (namely, whether $H^+$ or $He^+$). Their respective dose was controlled such that both had the same electric characteristic (recovery characteristic). The dose was a practical value in the range of about 10 to 100 $cm^{-3}$, in the relative values in FIG. 22.

In the case of proton implantation, as shown in symbol R1 in FIG. 3, measurement is made on a low resistance region between a high resistance part damaged by proton implantation and an N− layer of a wafer. Here, the term "damage" is understood to mean that the resistance of a semiconductor layer is increased by implantation of a light ion. The reason for this seems that a damaged layer formed by proton is turned to be a donor (impurity) by the subsequent heat treatment. This donar phenomenon is considered to occur in practice across the damaged layer. Hence, breakdown voltage decreases with proton implantation.

On the other hand, in the case of helium ion implantation shown in FIG. 4, as best shown by comparison with FIG. 3, such a donor phenomenon as indicated by a region R1 of FIG. 3 is not caused, and a spreading resistance R or resistivity ρ decreases monotonically with increasing depth L from the first main surface of the anode P layer 3 or the depth from the interface S2. That is, the damaged part formed by helium ion implantation is measured as a high resistance region, and it can be judged that such a donor phenomenon as in proton implantation is not caused. Accordingly, with helium ion implantation, only a damage due to implantation is formed within an n layer in the vicinity of a junction, and thus no reduction in breakdown voltage Vr (FIG. 18) is caused by implantation. Of course, this does not depend upon helium ion dose.

Figure 23:
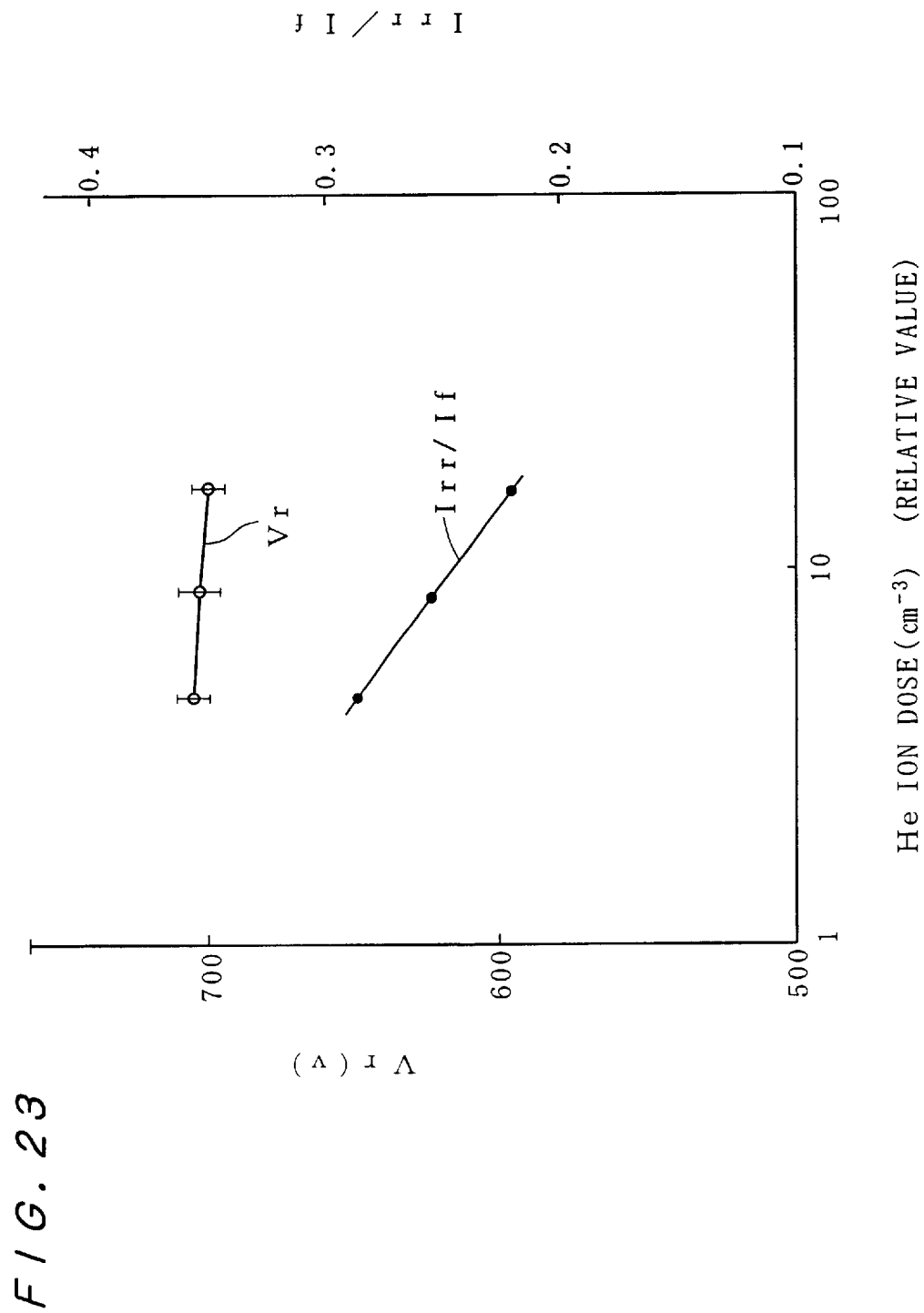
FIG. 23 is a diagram showing the result of measurement of breakdown voltage and recovery peak current when helium ions are implanted.

FIG. 23 shows the result of measurement as to characteristics of breakdown voltage Vr and recovery peak current Irr, to helium ion dose. The left and right ordinates of FIG. 23 indicate breakdown voltage Vr and relative ratio (Irr/If), respectively, as in FIG. 22. As best shown of FIG. 22 with FIG. 23, for helium ion implantation, hardly or no change in breakdown voltage Vr is observed even when implanting helium ions of a dose of approximately 10 to 100 $cm^{-3}$ (relative value) with which a sufficiently small recovery current value Irr can be realized in practice.

As stated above, the formation of the low lifetime region 2 by means of helium ion implantation effects the action of preventing the N− layer part subjected to implantation from becoming donor even after heat treatment, thereby making breakdown voltage Vr unchanged.

(4) Description will now be made of reverse recovery characteristic of the diode of the structure of FIG. 1.

In this diode, the low lifetime region 2 damaged by helium ion implantation is formed in the vicinity of the anode, namely, around the interface S2 that is a PN junction surface. Therefore, ① the carrier density in the vicinity of the anode decreases markedly, and recovery peak current Irr lowers markedly. In addition, ③ there occurs no deterioration in breakdown voltage Vr due to implantation, as stated in the item (3).

Also, in this diode, a damage due to helium implantation is locally formed in the vicinity of the anode alone. Thus, as compared with a conventional diode in which such a damage is not formed, it is necessary to extend the lifetime of carriers in other regions whereat no damage is formed, namely, the N− layer 1B and cathode N+ layer 1A in FIG. 1. The reason for this is that, since the low lifetime region 2 is locally formed in the N− layer 1B, if the lifetime of other N type layers is set to the same value as in the case where the region 2 is not formed, on state voltage Vf during on state is increased to cause loss. To avoid this, it is necessary to control the lifetime of other N type layers such as to be extended for reducing on state voltage Vf. This can be realized by optimizing thickness d of the low lifetime region 2, and applying the mentioned technique of diffusing a heavy metal. The realization of the long lifetime increases the carrier density in the vicinity of the cathode, so that a recovery current dissipation time Trr is extended.

Figure 5:
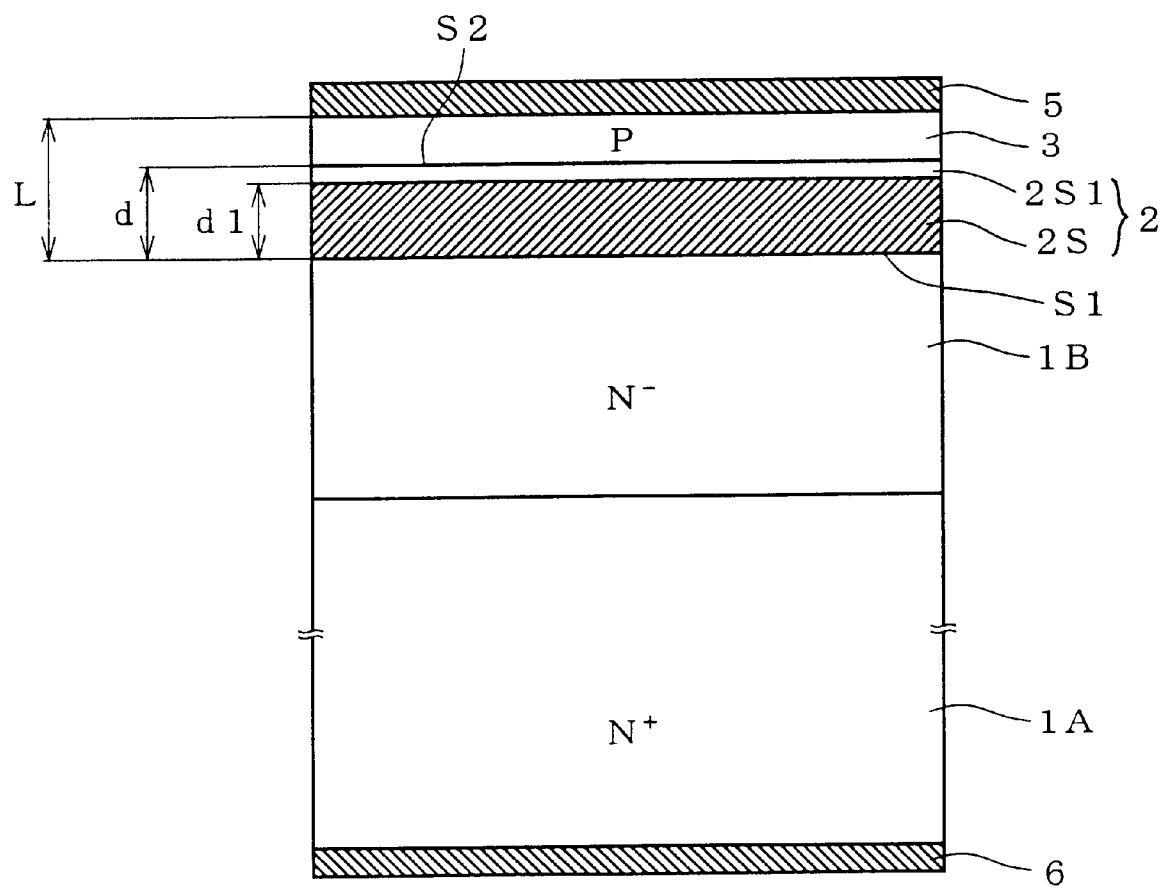
FIG. 5 is a longitudinal cross section illustrating a simulation model in this invention.

(5) FIG. 5 shows a simulation model for analyzing reverse recovery characteristic of a diode formed with the low lifetime region 2. In FIG. 5, the same symbol as in FIG. 1 denotes the same part. Note that in this model the region corresponding to the low lifetime region 2 of FIG. 1 is divided into a region 2S and a region 2S1 of FIG. 5. Of these, one region 2S is the region that is set in consideration of the half width of helium ion beam (≈10 μm), and thickness dl of the region 2S is set to have an amount equivalent to the half width. Therefore, the other region 2S1 part in the model of FIG. 5 must be actually a damaged part subjected to helium ion implantation, however, for convenience in simulation, the region 2S1 is merely handled as an N type semiconductor layer having the same lifetime as the N− layer 1B. In actual, both regions 2S and 2S1 are the layer damaged by helium ion implantation. Thus, the following relationship seems to be established: τ1 >τ2S1 >τ2S, wherein the lifetime of the regions 2S and 2S1 are τ2S and τ2S1, respectively. Accordingly, in FIG. 1, both regions 2S and 2S1 of FIG. 5 are defined integrally as the second semiconductor layer (low lifetime layer) 2.

In performing this simulation, each parameter is set as follows. Specifically, the model diode is set to a diode in the breakdown voltage of 600 V class, and the specific resistance and thickness of the N− layer 1B are set to 30 Ω. cm and 30 μm, respectively. Note that the model is set to one which has a concentration slope part of an approximately 100 μm between the N− layer 1B and N+ layer (N+ substrate) in order to correspond to the actual use of a diffused wafer. Depth or thickness of the anode P layer 3 is set to 3 μm such as to correspond to the actual diode, and its surface concentration is set to le 17. As to the lifetime of a diode having no low lifetime region, namely, corresponding to the conventional technique shown in FIG. 17, its entire region is set to 50 n sec. On the other hand, when a low lifetime region is present, width dl of the low lifetime region 2S in the model of FIG. 5 is set to 10 μm such as to correspond to the half width of helium ion beam, the lifetime of the region 2S is set to 8 n sec. (<1/10×200 n sec.), and the lifetime of other regions (2S1, 1B, and 1A) is set to 200 n sec. Then, a simulation of recovery characteristic has been executed by changing the position from the interface S2 of the low lifetime region 2 or 2S, or depth d.

Figure 18:
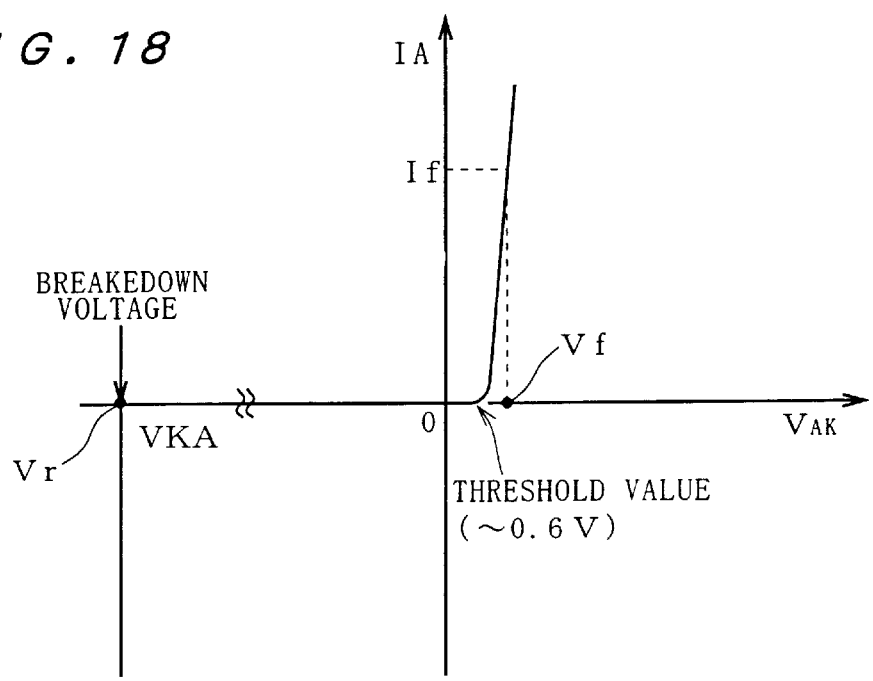
FIG. 18 is a diagram showing output characteristic of a diode.
Figure 19:
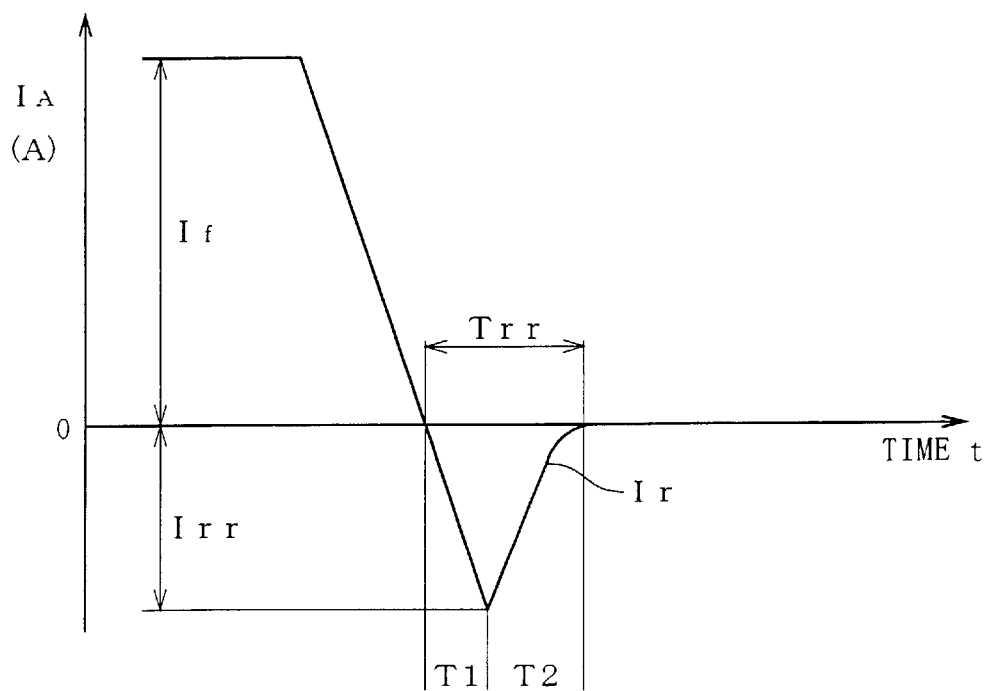
FIG. 19 is a diagram showing reverse recovery characteristic of a diode.
Figure 20:
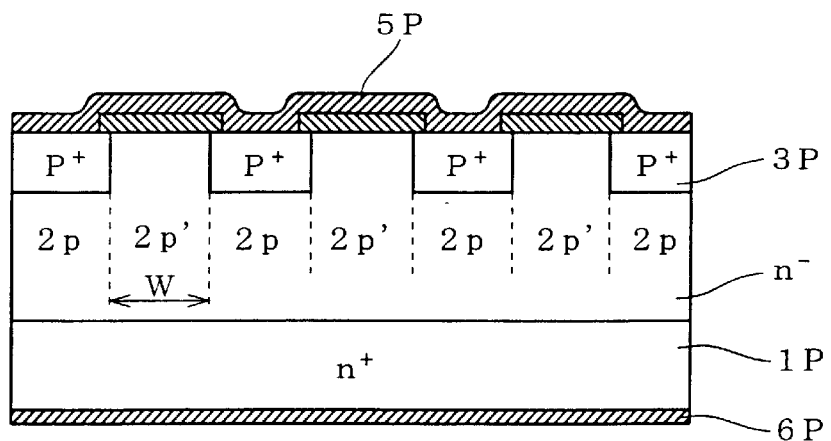
FIG. 20 is a cross section illustrating an example of the structure of a diode when the conventional second technique is applied.
Figure 21:
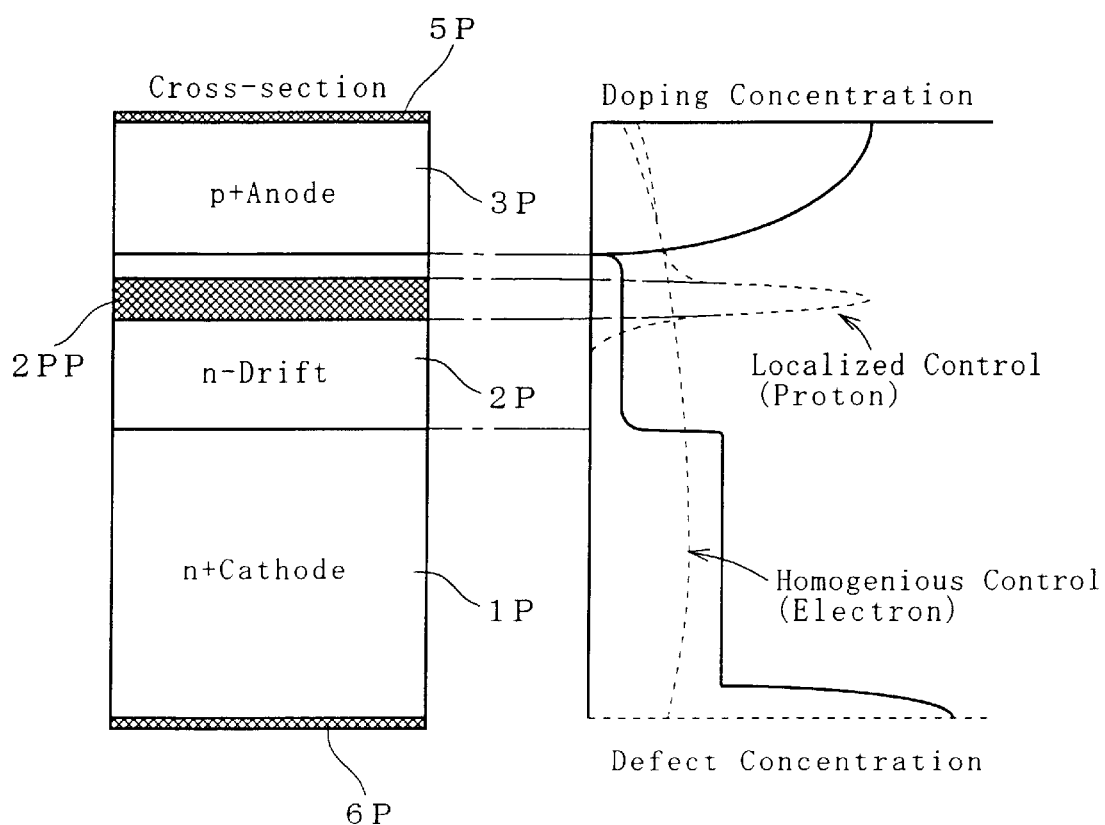
FIG. 21 is a cross section illustrating an example of the structure of a diode when the conventional fourth technique is applied.

The simulation has been conducted with respect to on state voltage Vf shown in FIG. 18 and reverse recovery characteristic (Irr, Trr) shown in FIG. 19, by using a commercially available simulator Medici. The obtained result of the simulation is shown in FIG. 6.

Figure 6:
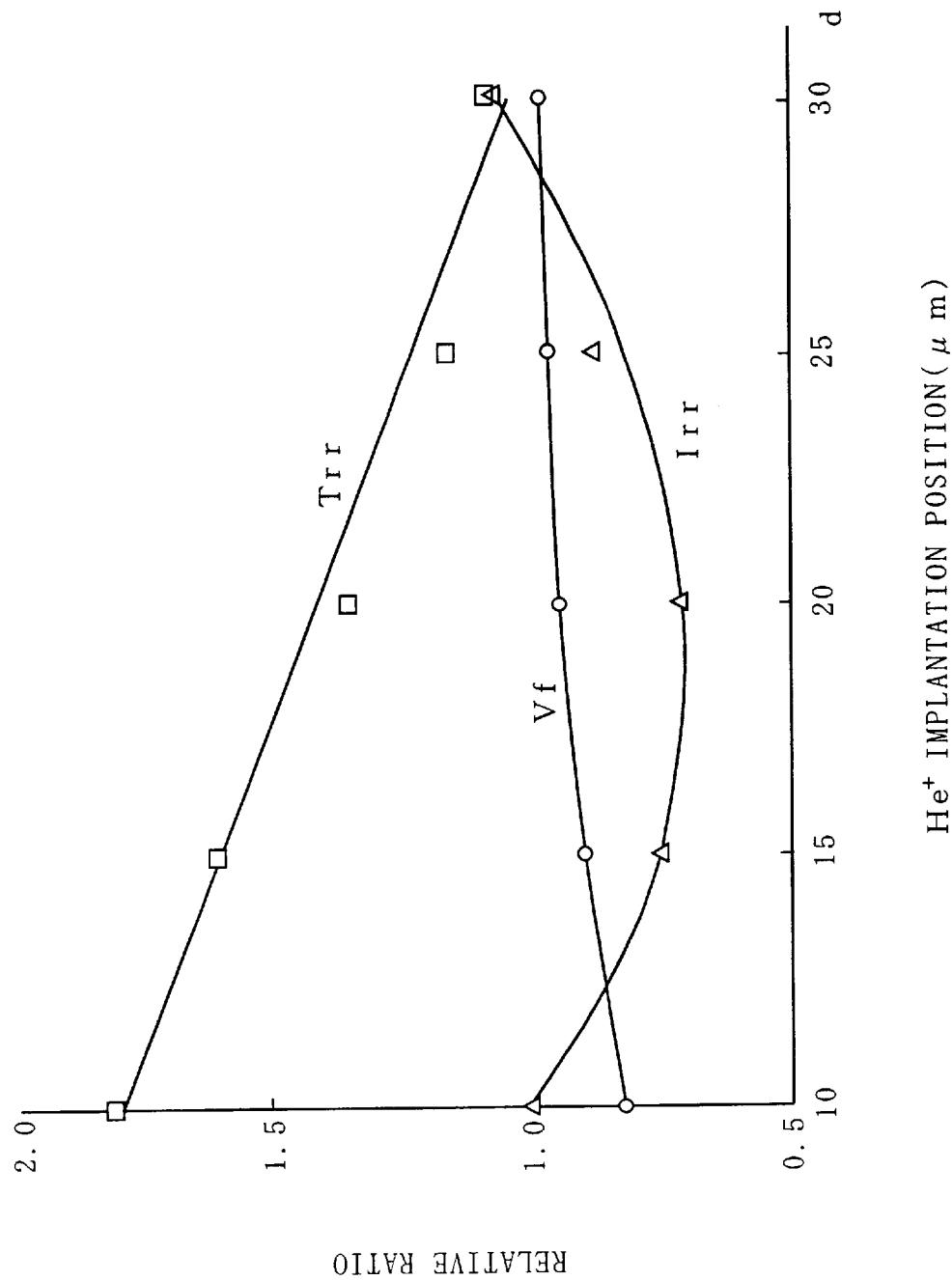
FIG. 6 is a diagram showing the result of a simulation to the model of FIG. 5.
Figure 17:
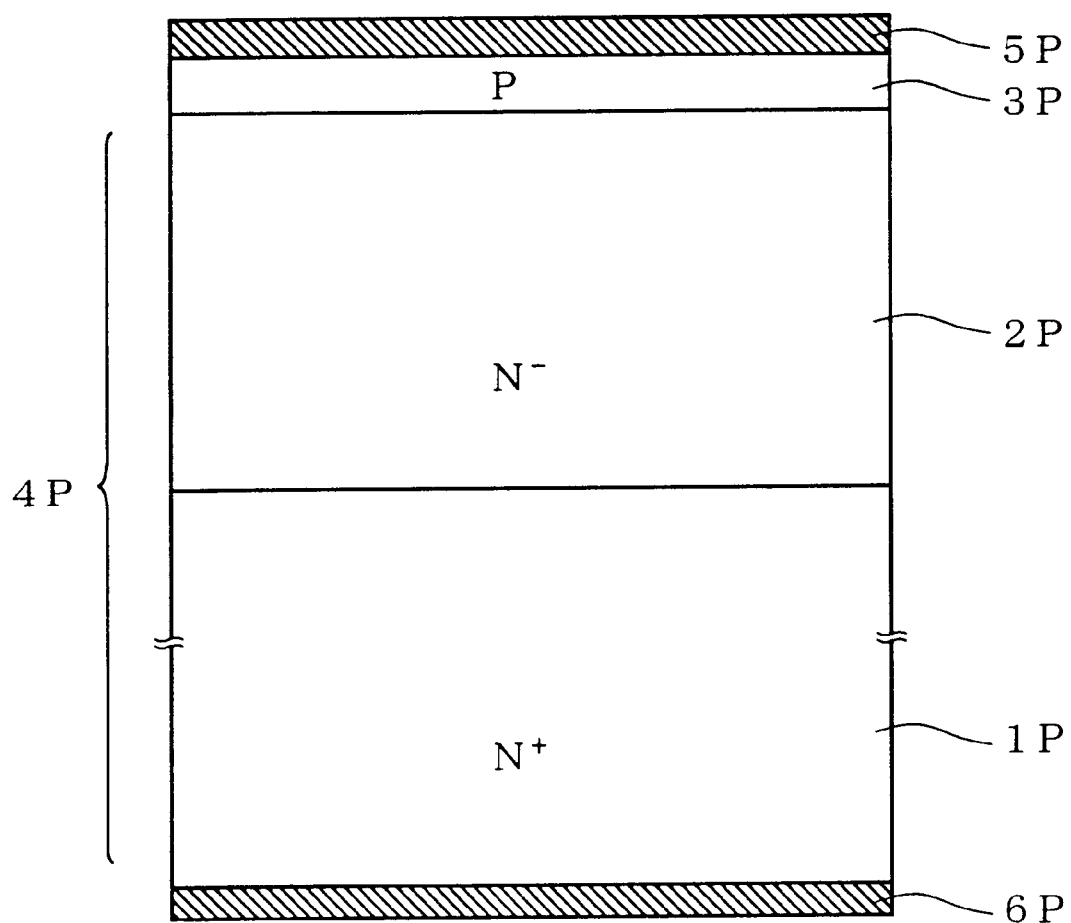
FIG. 17 is a cross section illustrating the structure of a conventional general diode.

In FIG. 6, the respective characteristics Trr, Irr and Vf are indicated as a standard value of each characteristic, which is obtained when all regions have the same carrier lifetime (that is, in the absence of a region 2S). Accordingly, when a relative ratio is 1, the device shows the same characteristic as that of a conventional one (e.g., one which is shown in FIG. 17).

Under consideration of the simulation result of FIG. 6, the following points can be understood. Firstly, on state voltage Vf increases as the low lifetime region 2S is formed more deeply within the N type substrate. On the other hand, recovery peak current Irr is minimized when its formation depth is 20 μm, and increases when the position of irradiation is apart from the position at that time. As opposed to on state voltage Vf, recovery current dissipation time Trr decreases as the low lifetime region 2S is formed more deeply. These results show that, as the low lifetime region 2S is formed more deeply from the interface S2, the carrier density in the vicinity of the anode is decreased to increase on state voltage Vf. The reason why the recovery peak current Irr has a minimum value is considered that since the regions 2S1 and 2S are set in the model of FIG. 5, as the low lifetime region 2S becomes deeper, on the contrary, the number of carriers in the vicinity of the anode, namely, the number of carriers in the region 2S1 increases. Further, since the number of carriers on the cathode side is decreased as the low lifetime region 2S is formed more deeply, recovery current dissipation time Trr is reduced as the low lifetime region 2S becomes deeper.

To achieve the mentioned objects ① to ③ of the invention, it is necessary to set thickness of the low lifetime region 2 or 2S, or depth d, such as to establish the relationships of Vf≈1 (no change in on state voltage Vf, i.e., an extension of time Trr), krr<1, and Trr>1, in the relative value in the simulation of FIG. 6. Especially, it should be regarded as significant to establish the relationship of Irr<1. If evaluated the simulation result of FIG. 6 in view of the foregoing, it is understood that superior soft recovery characteristics than was previously possible can be obtained when thickness d of the low lifetime region 2 or 2S is controlled in the range of 10 μm to 30 μm.

In addition, there was investigated the carrier density in on state when helium ion implantation position d is set to the implantation position of 30 μm of FIG. 6 where the time Trr equals that of a conventional one. As a result, the depth of the point where a density distribution of holes injected from the anode electrode 5 and a concentration distribution on the side of the N substrate 1 cross, that is, the position at which the impurity concentration of the first semiconductor layer 1 in on state equals the concentration of carriers injected into the first semiconductor layer 1, is located at the position of 58 μm when viewed from the interface S2. The helium ion implantation position d is therefore controlled in the range of from 10 μm to 30 μm, as stated earlier. Thus, by setting the helium ion implantation position d to not more than half of the depth of the point where the holes injected from the anode electrode 5 and the N substrate 1 cross, it is possible to set the recovery current dissipation time Trr to the time (the relative value of time Trr>1) longer than that of the conventional case where no diffusion of a heavy metal nor irradiation of electron beam is performed (FIG. 17).

Figure 7:
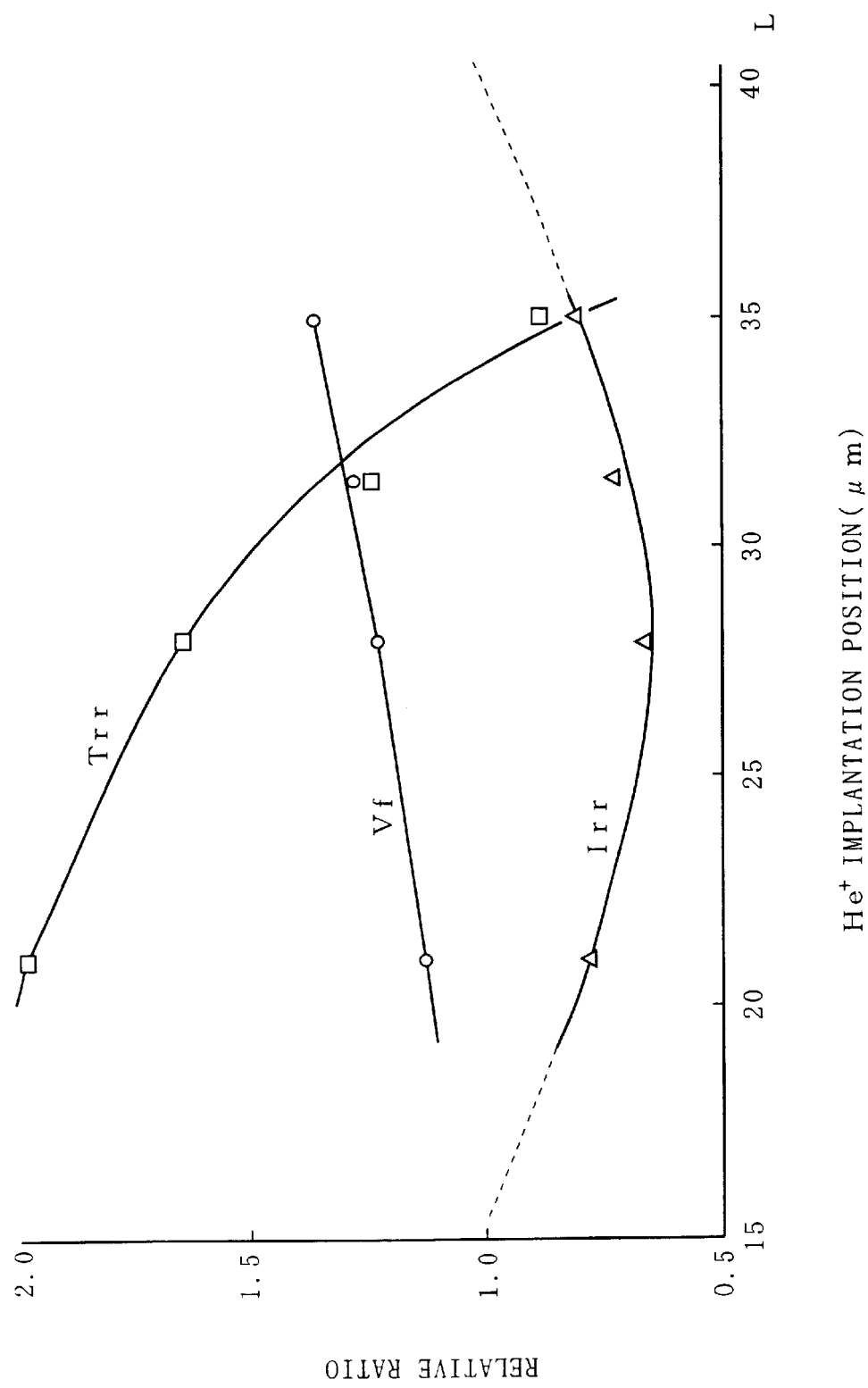
FIG. 7 is a diagram showing the result of a prototype of the diode in the first preferred embodiment.
Figure 8:
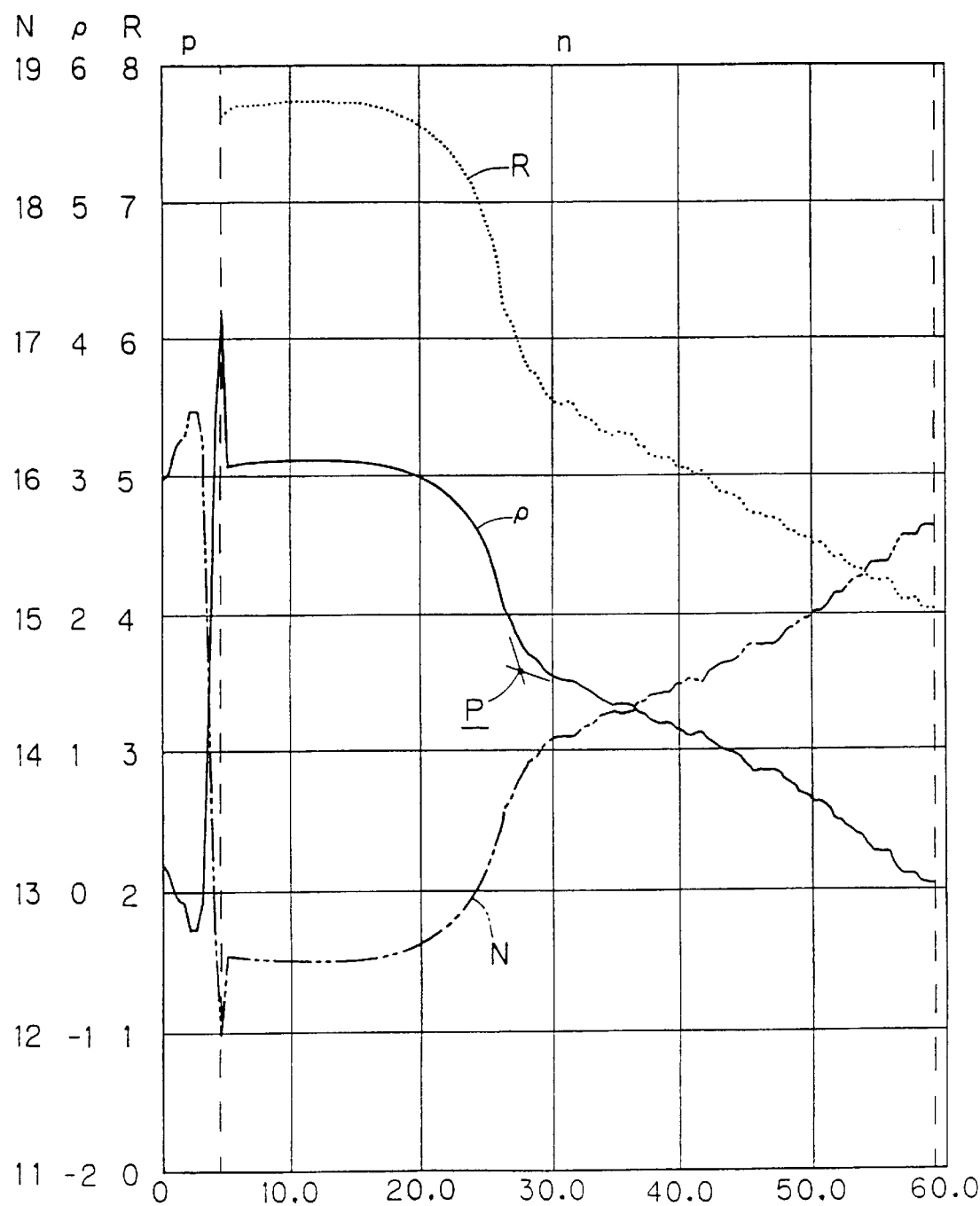
FIG. 8 is a diagram showing the result of SR measurement when a recovery peak current has the minimum value in the result of FIG. 7.

(6) Thereafter, in view of the simulation result, a diode has been prepared experimentally in practice. In the preparation, to a pin structure in which a lifetime control to the whole has been weakened than a conventional diode, the mentioned helium ion implantation has been carried out, followed by heat treatment (anneal). Then, like the mentioned simulation, investigation has been made as to how the respective characteristics Vf, Irr and Trr depend upon helium ion implantation position. Herein, the helium ion implantation position is indicated by depth L (see FIG. 1), including the anode P layer 3 (approximately 3 μm thick). Helium ion implantation has been performed under the condition that half width of irradiated beam is 10 μm, as in the simulation, and its dose is about 10 to 100 cm$^{-3}$ (see FIG. 22) in a practical relative value level. In the experimental preparation, the result of SR measurement of the diode subjected to heat treatment is also evaluated (see FIGS. 4 and 8), and the point where the resistivity change of the damaged low lifetime region and the resistivity change of the N substrate cross, which corresponds to a point P in the examples of FIGS. 4 and 8, is defined as helium ion implantation position L. The result of the manufactured prototype is shown in FIG. 7. Like FIG. 6, the ordinate of FIG. 7 is given as a relative value to the characteristic of a conventional structure in the absence of a region 2 (see FIG. 17).

As shown in FIG. 7, the prototype result is also almost the same as the simulation result of FIG. 6, and on state voltage Vf increases as the low lifetime region 2 (FIG. 1) becomes deeper. Recovery peak current Irr is minimized when depth L is 28 μm, and increases when the helium ion irradiation position L is apart from that depth (=28 μm). As opposed to on state voltage Vf, recovery current dissipation time Trr decreases as position L of the low lifetime region 2 becomes deeper. In FIGS. 6 and 7, even when thickness of the anode P layer 3 is reduced, there occurs a difference in the change of the recovery peak current Irr in the vicinity of the minimum value of recovery peak current Irr, with respect to the helium ion implantation position (in FIG. 7, the change of recovery current Irr is small). This seems to be caused by the fact that in the simulation of FIG. 6, the region 2S1 of FIG. 5 is treated as a non-damaged region. Therefore, it is found that the region 2S1 of FIG. 5 has to be regarded in practice as a damaged region.

From the prototype result of FIG. 7, as compared with the conventional case, recovery characteristic is improved than was previously possible, by setting position L of the low lifetime region 2 to the range of 15 μm to 40 μm (which especially gives the result that: recovery peak current Irr<1).

FIG. 8 shows the result of SR measurement obtained when a prototype has been manufactured by controlling hellum ion implantation position L from the first main surface of the anode P layer 3 such as to be 28 μm in FIG. 7. As apparent from FIG. 8, the resistance of the damaged low lifetime region is over about 50 times of that before it is damaged. It is therefore desirable that the resistivity of the low lifetime region 2 is set to not less than 50 times of that of the first semiconductor layer 1. As to lifetime, in view of setting of the mentioned simulation conditions, it is desirable to establish the relationship of: (lifetime τ2 of the low lifetime region 2)<⅒×(lifetime τ1 of the first semiconductor layer 1). This enables to optimize the carrier density of the N type substrate 1.

Figure 9:
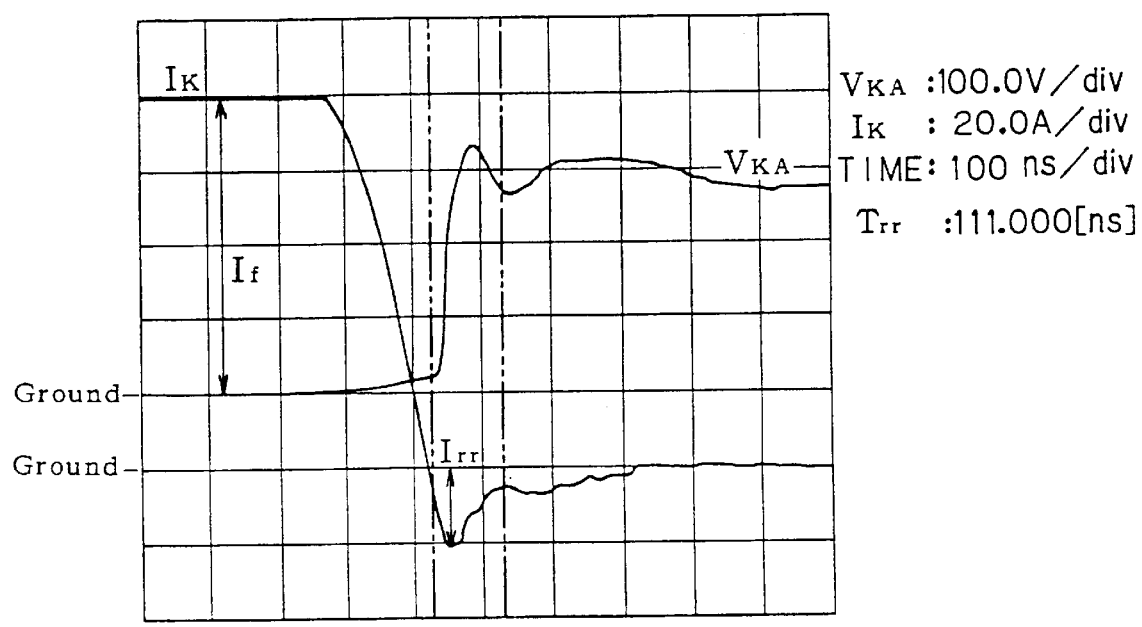
FIG. 9 is a diagram showing the result of the prototype of the diode in the first preferred embodiment.
Figure 10:
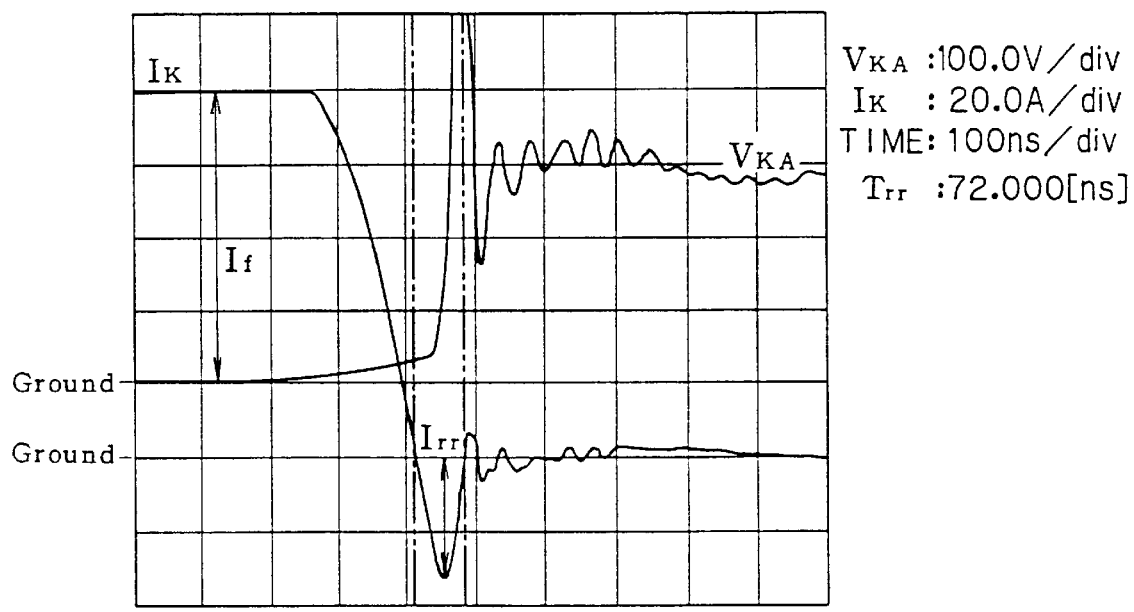
FIG. 10 is a diagram showing the result of measurement of a conventional diode, for comparison with FIG. 9.

FIG. 9 shows recovery characteristic obtained when helium ion implantation position L has been controlled to the position of 28 μm at which recovery peak current Irr is minimized, to form the low lifetime region 2. FIG. 10 shows the result of reverse recovery characteristic of a diode to which no helium ion implantation has been performed. In FIGS. 9 and 10, symbol $I_k$ denotes anode-cathode current. Other symbols are as described earlier. As best shown by comparison of FIG. 9 with FIG. 10, the diode of the invention in FIG. 9 has a smaller recovery peak current Irr and a longer recovery current dissipation time Trr.

(7) The foregoing description is made on the case where in a pin structure, the N type substrate 1 and anode P layer 3 are taken as a first semiconductor layer of a first conductivity type and a third semiconductor layer of a second conductivity type, respectively, an intermediate layer sandwiched therebetween is taken as the low lifetime region 2, and the anode electrode 5 and cathode electrode 6 are taken as first and second main electrodes, respectively (see FIG. 1). The invention is, however, not limited thereto and applicable to a semiconductor device in which (i) a p type semiconductor substrate is taken as the first semiconductor layer of the first conductivity, (ii) a p type semiconductor layer formed thereon which has a shorter lifetime and resistivity that decreases monotonically, is taken as the second semiconductor layer of the first conductivity type, (iii) a cathode n layer formed thereon is taken as the third semiconductor layer of the second conductivity type, and (iv) a cathode electrode and an anode electrode are taken as the first and second main electrodes, respectively. In this case, the second semiconductor layer is a mere damaged region upon receipt of implantation of a predetermined ion such as helium ion, and has the property of not becoming acceptor even by the subsequent heat treatment (thus, causing a monotonic decrease in resistivity).

(8) The diodes of FIGS. 1, 6 and 7 have a structure resulting from the diffusion of a heavy metal, such as platinum, into the—layer 1B and N+ layer 1A prior to helium ion implantation. The invention is, however, not limited thereto and is also applicable to a diode in which a low lifetime region 2 is formed by helium ion implantation without the abovenoted prior diffusion of the heavy metal. In this case, the effect owing to the heavy metal diffusion, namely, the above-mentioned effect ② an increase in the carrier density on the cathode side, no change in on state voltage Vf (to a conventional diode subjected to a heavy metal diffusion), and retention of an extension of dissipation time Trr), cannot be obtained, however, the above-mentioned characteristic effects ① (a further decrease in current Irr) and ③ (no change in breakdown voltage) can be obtained. Accordingly, the diode in which a low lifetime region 2 is formed by helium ion implantation without the above-noted prior diffusion of the heavy metal has beneficial results associated therewith.

(9) The foregoing description based on FIG. 1 is made on the case where the low lifetime region 2 of FIG. 1 is formed by utilizing helium ion as a representative of light ions or predetermined ions. One other than helium ion may be utilized as a light ion. Here, the term "light ion" is used in a wider sense to comprise ions of relatively light atoms, which includes ions of atoms from helium whose atomic number is 2, to oxygen whose atomic number is 8, except for hydrogen ion, namely, proton. It is especially effective to use, as a predetermined ion, the ion of an atom such as He, Li and Be, belonging to the class of constituting no semiconductor impurity generally called donor or acceptor, to silicon.

Second Preferred Embodiment

Description will now be made of a suitable method of manufacturing a diode. Longitudinal cross sections of FIGS. 11 to 14 illustrate manufacturing steps in this embodiment.

Figure 11:
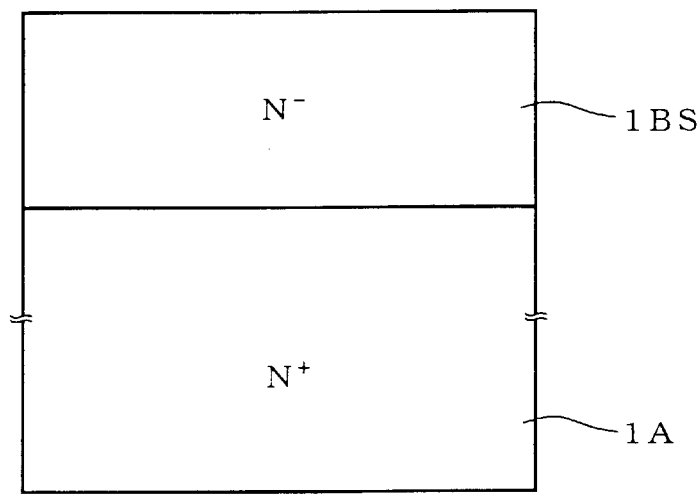
FIG. 11 is a cross section illustrating a method of manufacturing a diode in a second preferred embodiment of this invention.

To manufacture the diode, in a first step shown in FIG. 11, there is firstly prepared an N type substrate 1 comprising an N+ layer 1A and N− layer 1B (corresponding to a first semiconductor layer of a first conductivity type).

Figure 12:
FIG. 12 is another cross section illustrating the method of manufacturing a diode in the second preferred embodiment.
Figure 12:
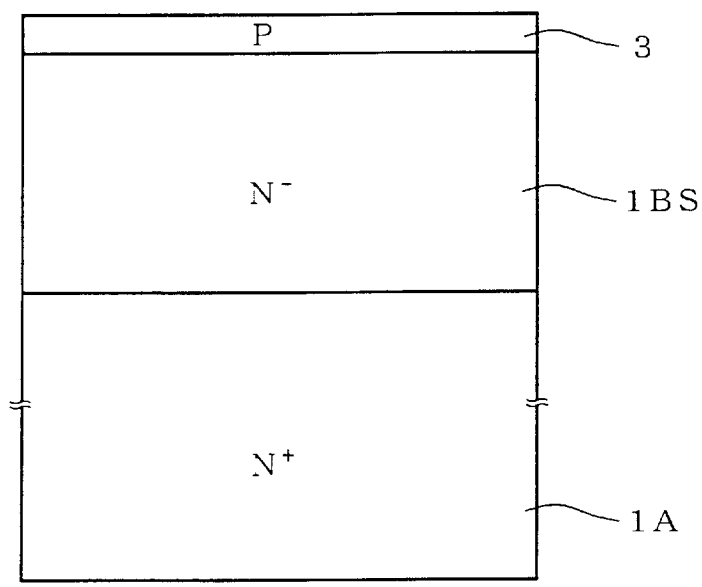
Figure 13:
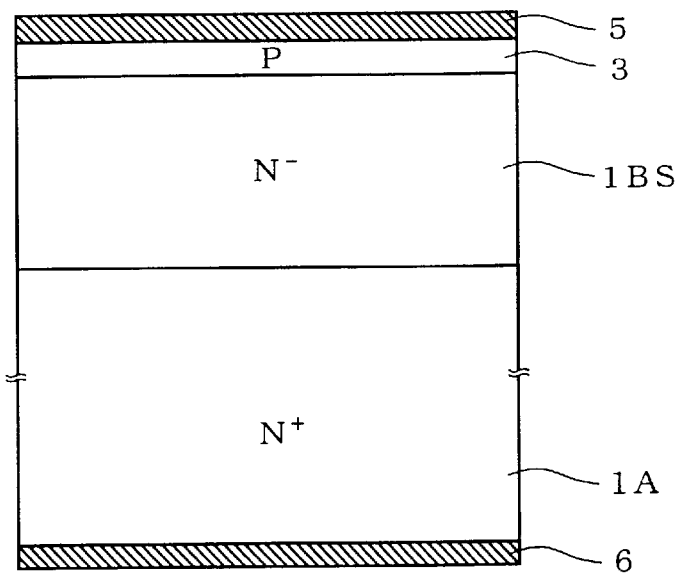
FIG. 13 is another cross section illustrating the method of manufacturing a diode in the second preferred embodiment.

In a second step, as shown in FIG. 12, a P type impurity is implanted from an exposed surface of the N− layer 1B, followed by annealing, to form an anode region 3 (a second semiconductor layer of a second conductivity type) on the N− layer surface. Thereafter, as shown in FIG. 13, an anode electrode (first main electrode) 5 is formed on a surface of the N type substrate 1, and a cathode electrode (second main electrode) 6 is formed on a rear surface of the N type substrate 1. Note that the cathode electrode 6 may be formed after a third step as described later.

Figure 14:
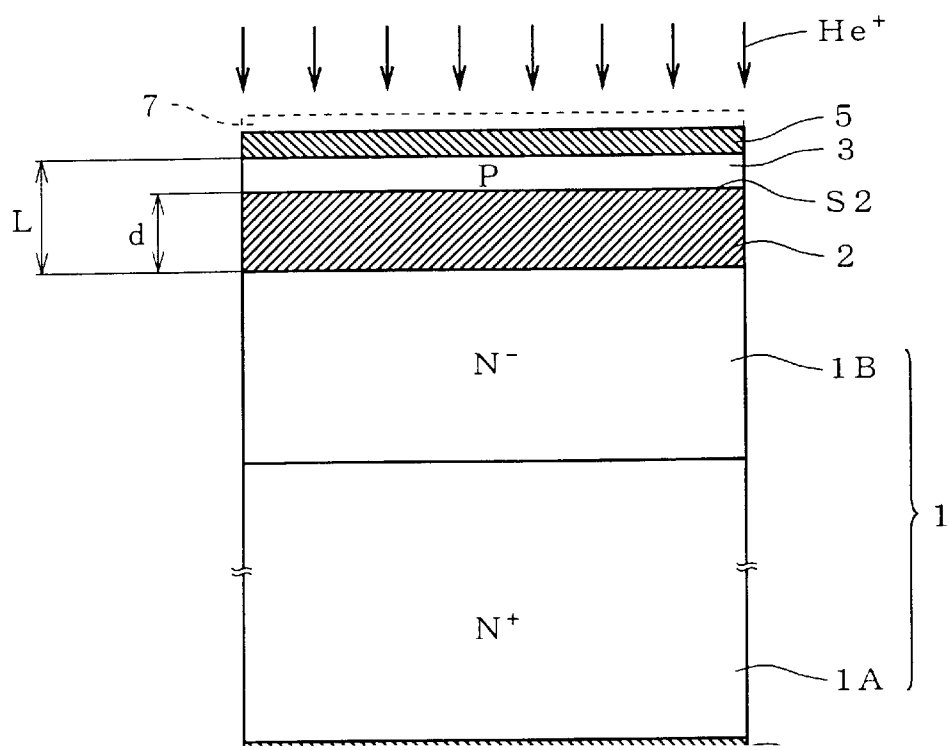
FIG. 14 is another cross section illustrating the method of manufacturing a diode in the second preferred embodiment.

In the third step shown in FIG. 14, firstly, a predetermined ion source is disposed on the anode side as opposed to the anode electrode 5. The predetermined ion source is an implantation source of a light ion except for hydrogen ion (proton) and, herein, that is an irradiation source of helium ion beam that is a representative of light ions. Then, a buffer layer 7 (e.g., aluminum foil) for adjusting depth of helium ion implantation without changing its dose, is disposed in front of the anode electrode 5 (the accelerated energy of helium ion beam is decreased by thickness of the buffer layer 7) and, via the buffer layer 7, helium ion is implanted from an interface S2 to the N− layer 1B at a predetermined depth d (a predetermined depth L when viewed from one surface 3S1 of the anode region 3 on which the anode electrode 5 is formed). Thereafter, a heat treatment of 300°C. to 400°C. (first heat treatment) is executed for the device subjected to the implantation. Thereby, a low lifetime region 2 with thickness d is formed in an N− layer 1BS in the vicinity of the interface S2. Other N− layer part is indicated by symbol 1B. At this time, by implanting helium from the surface of the anode electrode 5, it is possible to reduce variations in the implantation position to the anode surface (interface S2), as compared with the implantation from the cathode surface. The range of the predetermined depth L is desirably from 15 $\mu$m to 40 $\mu$m, as stated in the first preferred embodiment, in view of the fact that thickness of the anode region 3 is about 3 $\mu$m.

Through the first to third steps, a new diode structure as shown in FIG. 1 is obtainable. That is, a semiconductor device having a smaller recovery peak current Irr and low-loss soft recovery characteristic can be formed easily without deteriorating breakdown voltage, by using a helium ion beam generator that is a general-purpose light ion source. In this case, the number of steps is increased only by the step of FIG. 14.

The technical idea described in this embodiment is basically applicable to the case where a low lifetime region is formed in the vicinity of a PN junction surface in an anode region.

Third Preferred Embodiment

Figure 15:
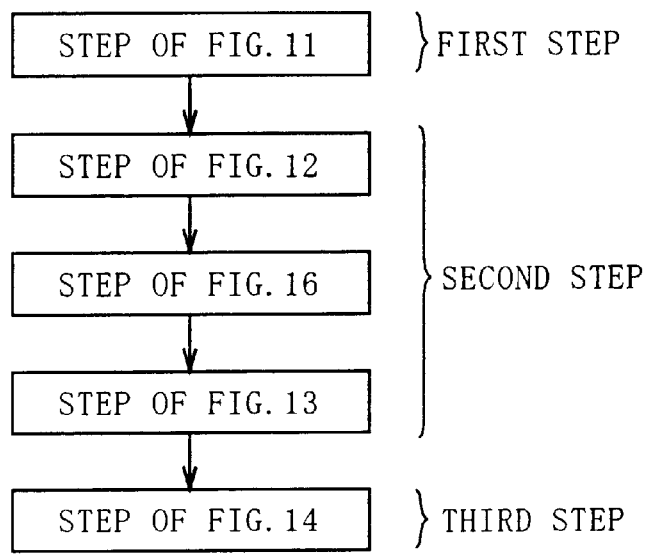
FIG. 15 is a flowchart illustrating manufacturing steps in a third preferred embodiment of this invention.
Figure 16:
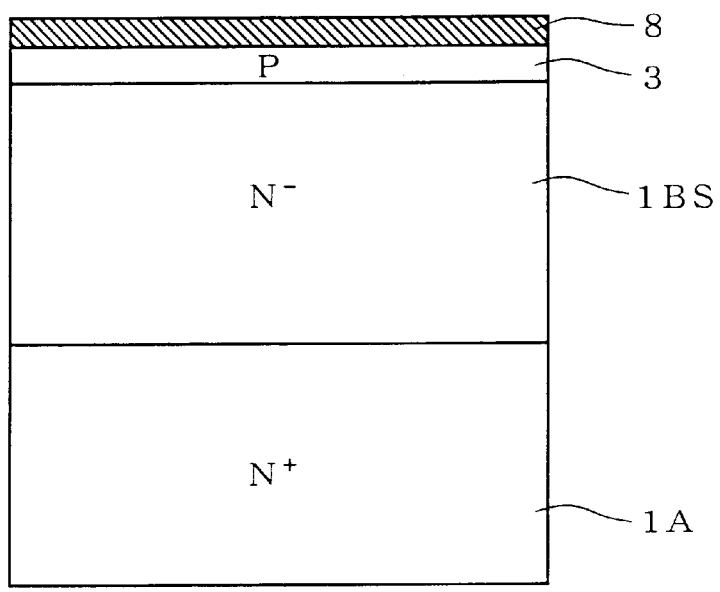
FIG. 16 is a cross section partially illustrating the second step in FIG. 15.

FIG. 15 shows a flowchart illustrating manufacturing steps of a third preferred embodiment. As apparent from FIG. 15, this embodiment is characterized in adding, prior to the step of implanting helium ion, the step of diffusing a heavy metal as shown in FIG. 16, into the second step as described in the second preferred embodiment. The step of diffusing a heavy metal itself corresponds to the mentioned first conventional technique. Specifically, the lifetime of carriers on the cathode N+ layer 1A side in FIG. 1 is increased, and the carrier density on the cathode side is increased to prevent an increase in on state voltage Vf that is caused by provision of a low lifetime region 2, thereby extending time Trr.

Hereinafter, a method of manufacturing a diode in which the lifetime on the cathode side can be controlled such as to be further extended, by referring to the processing drawing in FIG. 16.

Specifically, in the manufacturing method described in the second preferred embodiment, after the step of FIG. 12, a heavy metal such as platinum or gold is sputtered on a surface of an anode region 3 as shown in FIG. 16, and then subjected to a heat treatment of 800° C. to 900° C. (second heat treatment) to diffuse the heavy metal into an N− layer 1BS and N+ layer 1A. Thereby, a region having a lifetime longer than that of the low lifetime region 2 is formed from the N+ layer 1BS to the N+ layer 1A. This heat treatment temperature is sufficiently higher than the heat treatment temperature after the helium ion implantation in the step of FIG. 14. Therefore, as in this embodiment, by inserting the step of diffusing a heavy metal between the step of FIG. 12 and the step of FIG. 13, the lifetime in the vicinity of the anode and that in the vicinity of the cathode can be controlled in separate steps, respectively.

From the foregoing, with the manufacturing method of this embodiment, it is possible to provide a semiconductor device permitting a further improvement in soft recovery characteristic (a reduction in Irr, and an increase in Trr) without deteriorating the withstand voltage.

SUMMARY

The diodes in the respective preferred embodiments of the invention enable to reduce the carrier density in the vicinity of the third semiconductor layer to fairly reduce reverse current of reverse recovery characteristic without causing any influence on breakdown voltage, because these have the low lifetime region 2 with a resistivity decreasing monotonically which is formed from the bottom surface of the third semiconductor layer on the first main electrode side to a predetermined depth. In addition, since the lifetime of the low lifetime region 2 and the lifetime of other regions are controlled separately to their respective optimum values, it is possible to control in the direction of increasing the carrier density of the first semiconductor layer on the second main electrode side, thereby improving reverse recovery characteristic.

Accordingly, in the diodes of the invention, breakdown voltage is determined by the first and third semiconductor layers, because the resistance of the low lifetime region decreases monotonically.

With the method of manufacturing of a diode in the invention, a diode having such an improved soft recovery characteristic can be manufactured easily with versatility.

The scope of the invention is given by the appended claims and not to be limited to the description in the foregoing specification. All the modifications and variants within the scope of the claims come within the scope of the invention.

This invention can effectively exhibit its features particularly when it is utilized in a pin diode among semiconductor devices. Also, a semiconductor device in accordance with the invention is useable as a free-wheel diode in a power module.

What is claimed is:

1. A semiconductor device comprising:
a first semiconductor layer of a first conductivity type;
a second semiconductor layer of said first conductivity type having a first main surface and a second main surface opposed to said first main surface, said first main surface and a main surface of said first semiconductor layer forming a first interface; and
a third semiconductor layer of a second conductivity type having a main surface which forms a second interface together with said second main surface of said second semiconductor layer,
wherein a second lifetime in said second semiconductor layer is smaller than a first lifetime in said first semiconductor layer; and
wherein a resistance value in said second semiconductor layer decreases monotonically from said second interface to said first interface.

2. A semiconductor device according to claim 1, wherein said second lifetime is smaller than $\frac{1}{10}$ of said first lifetime.

3. A semiconductor device according to claim 1, wherein a second resistibility of said second semiconductor layer is greater than 50 times of a first resistibility of said first semiconductor layer.

4. A semiconductor device according to claim 1, wherein thickness between said first interface of said second semiconductor layer and an other main surface opposed to said main surface of said third semiconductor layer is set such that a peak value of current flowing when voltage applied between said first semiconductor layer and said third semiconductor layer is changed from forward bias to reverse bias is smaller than a peak value of said current on the assumption that said second semiconductor layer is absent.

5. A semiconductor device according to claim 4, wherein said thickness is set to a value in a range of from 15 micrometers to 40 micrometers.

6. A semiconductor device according to claim 5, wherein said semiconductor device is used as a free-wheel diode.

7. A semiconductor device comprising:
a first semiconductor layer of a first conductivity type;
a second semiconductor layer of said first conductivity type which is formed on a surface of said first semiconductor layer and damaged throughout all regions thereof due to implantation of a predetermined ion selected from the group consisting of a helium ion, a lithium ion, a beryllium ion, a boron ion, a carbon ion, a nitrogen ion, and an oxygen ion; and
a third semiconductor layer of a second conductivity type which is formed on a surface of said second semiconductor layer,
wherein a second lifetime in said second semiconductor layer is smaller than $\frac{1}{10}$ a first lifetime in said first semiconductor layer.

8. A semiconductor device according to claim 7, wherein said selected predetermined ion is the lithium ion or the beryllium ion.

9. A semiconductor device according to claim 7, wherein said selected predetermined ion is the helium ion.

10. A semiconductor device according to claim 9, wherein said first semiconductor layer comprises diffused heavy metals.

11. A method of manufacturing a semiconductor device comprising:
a first step of preparing a first semiconductor layer of a first conductivity type having a first lifetime;
a second step of forming a second semiconductor layer of a second conductivity type on a surface of said first semiconductor layer; and
a third step of forming a low lifetime region extending from said surface of said first semiconductor layer to a predetermined position inside of said first semiconductor layer and having a second lifetime smaller than said first lifetime and a resistance value monotonically decreasing from said surface of said first semiconductor layer.

12. A method of manufacturing a semiconductor device according to claim 11, wherein said third step comprises:
a step of implanting a lithium ion or a beryllium ion from a surface side of said second semiconductor layer to said predetermined position inside of said first semiconductor layer.

13. A method of manufacturing a semiconductor device according to claim 11, wherein said third step comprises:
a step of implanting a predetermined ion selected from the group consisting of a helium ion, a lithium ion, a beryllium ion, a boron ion, a carbon ion, a nitrogen ion, and an oxygen ion from a surface side of said second semiconductor layer to said predetermined position inside of said first semiconductor layer to form the low lifetime region.

14. A method of manufacturing a semiconductor device according to claim 13, wherein said selected predetermined ion is the helium ion.

15. A method of manufacturing a semiconductor device according to claim 13, wherein depth from said surface of said second semiconductor layer to said predetermined position is controlled in a range of from 15 micrometers to 40 micrometers.

16. A method of manufacturing a semiconductor device according to claim 13, wherein said third step further comprises a step of performing a first heat treatment to said semiconductor device after the step of said predetermined ion implantation.

17. A method of manufacturing a semiconductor device according to claim 16, wherein said second step further comprises a step of forming a main electrode on a surface of said second semiconductor layer; and said predetermined ion implantation is performed by using a predetermined ion source disposed on said main electrode side.

18. A method of manufacturing a semiconductor device according to claim 16, wherein said second step further comprises a step of diffusing a heavy metal from said surface of said first semiconductor layer to said inside of said first semiconductor layer and performing a second heat treatment after the step of forming said second semiconductor layer.

* * * * *